United States Patent [19]
Burke et al.

[11] Patent Number: 5,908,722
[45] Date of Patent: Jun. 1, 1999

[54] DUAL-SIDED EXPOSE MECHANISM FOR WEB PRODUCT

[75] Inventors: Edward Joseph Burke, Clarks Summit, Pa.; Donald Frederick Carter, Vestal, N.Y.; David Martin Dewey-Wright, Owego, N.Y.; David Erle Houser, Apalachin, N.Y.; John Thomas Legg, Glen Aubrey, N.Y.; Daniel Webster, deceased, late of Castle Creek, N.Y., by Corrine E. Webster, executrix

[73] Assignee: International Business Machines Corporation, Armonk, N.Y.

[21] Appl. No.: 09/059,190

[22] Filed: Apr. 13, 1998

Related U.S. Application Data

[62] Division of application No. 08/792,594, Jan. 31, 1997.

[51] Int. Cl.$^6$ .................................................. G03F 9/00
[52] U.S. Cl. .............................................. 430/22; 430/30
[58] Field of Search ........................................ 430/22, 30

[56] References Cited

U.S. PATENT DOCUMENTS

| | | | |
|---|---|---|---|
| 3,176,601 | 4/1965 | Bradley . | |
| 3,635,559 | 1/1972 | Harrell et al. | 355/85 |
| 3,810,694 | 5/1974 | Harrell et al. | 355/18 |
| 3,900,257 | 8/1975 | Woolley, Jr. et al. | 355/29 |
| 4,302,103 | 11/1981 | Zeunen | 355/84 |
| 4,666,294 | 5/1987 | Gelbert et al. | 355/89 |
| 4,996,560 | 2/1991 | Nanri et al. | 355/91 |
| 5,017,960 | 5/1991 | Tuulse | 355/91 |
| 5,083,156 | 1/1992 | Sato et al. | 355/91 |
| 5,144,365 | 9/1992 | Visage | 355/91 |
| 5,272,502 | 12/1993 | Saiki | 355/76 |
| 5,652,645 | 7/1997 | Jain | 355/53 |

*Primary Examiner*—Christopher G. Young
*Attorney, Agent, or Firm*—Calfee, Halter & Griswold LLP

[57] ABSTRACT

An apparatus and method of using same for exposing successive sections of opposite sides of a web of material to actinic radiation in patterns on each section of the opposite sides of the web is provided. The apparatus includes a first station having mechanisms to locate and expose selected sections on the first side of the web to actinic radiation in a first patterns, and a second station spaced from the first station having mechanisms to locate and expose selected sections on the second side of said web to actinic radiation. The first and second stations include first and second pattern masters and first and second mountings for the masters, and first and second sources of actinic radiation to project the desired patterns of exposure from each of the masters to each of the sections on the first and second sides of the web in very close registration or alignment thereof. Each of the stations includes a web locating device to locate the web and the master with respect to each other at each station, and each of said stations includes a mechanism to selectively maintain the master and web in a located position contacting each other during exposure, and a web transfer mechanism to periodically transport the sections to and from the stations. The invention also includes a program which uses fiducial marks on the masters and alignment devices on the web to provide a best fit of the master with the web at each location.

8 Claims, 28 Drawing Sheets

MATCH TO FIG. 1A

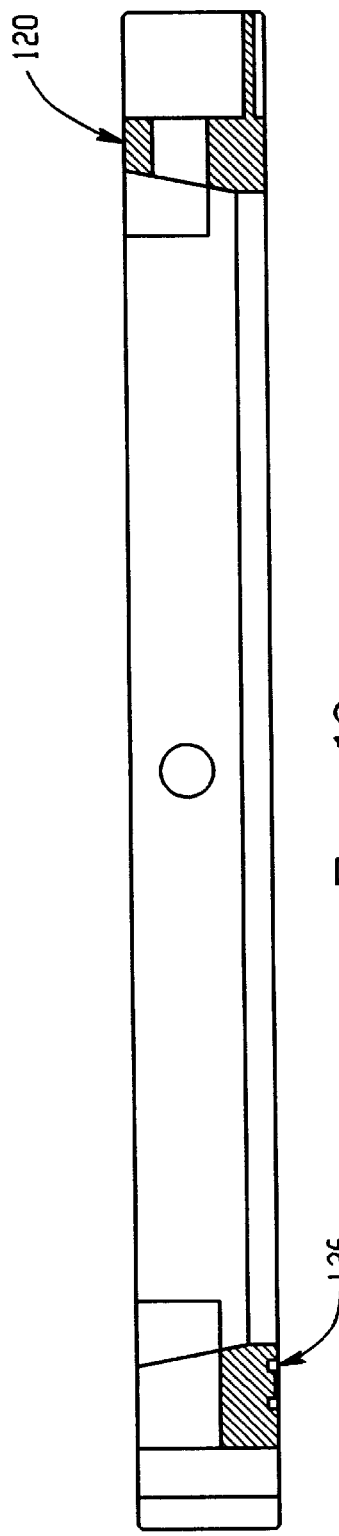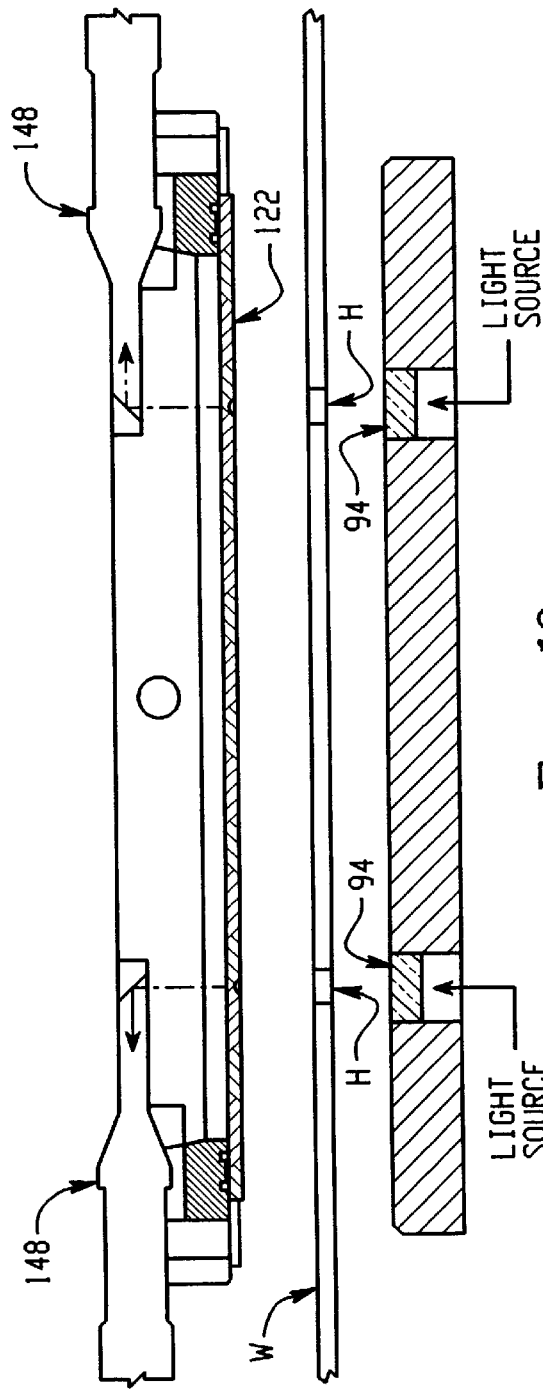

ACTS: 2 FEATURES J,K BEFORE TRANSLATION

ACTS: 2 FEATURES J,K AFTER TRANSLATION

ACTS: 3 FEATURES J,K AND L BEFORE TRANSLATION

ACTS: 3 FEATURES J,K AND L AFTER TRANSLATION

DUAL-SIDED EXPOSE MECHANISM FOR WEB PRODUCT

RELATED APPLICATIONS

This is a Divisional of copending patent application Ser. No. 08/792,594 filed Jan. 31, 1997.

FIELD OF THE INVENTION

This invention relates generally to exposure tools and a method for exposing the opposite sides of a web product to actinic radiation in photolithographic applications, and more particularly to a tool for and method of exposing opposite sides of a web product to actinic radiation for photolithographically forming patterns which are later utilized to manufacture electronic circuitry to form flexible circuits. In even more specific aspects, the present invention relates to a photolithographic tool and process for using the same to pattern expose opposite sides of a web or material, with each side having photoresist material secured thereto, at two spaced locations simultaneously with very close alignment between the pattern exposed on each surface.

BACKGROUND OF THE INVENTION

In the production of flexible circuitry, a conventional practice is to provide a relatively thin web or sheet of material with circuitry on one or both sides. The web of material is then used to make various electrical connections utilizing its flexibility. As the number of connections increase, it is increasingly desirable to have circuitry on both sides of the web of material, and hence this has become a significant product, i.e., a product with circuitry on both sides thereof. As the technology advances, the density of the circuitry increases, i.e., the width of the lines, decrease and the spacing between the lines decreases, thus allowing more circuitry to be provided in a given surface area. Also typically it is necessary for the circuitry or circuit traces on both sides of the flexible material to be in relatively close alignment with each other, i.e., the circuitry on one side must be in close alignment with the circuitry on the opposite side thereof. Hence, as the density of the circuitry increases, the tolerance for misalignment decreases, thus requiring closer and closer tolerances between the circuitry on opposite sides.

A photolithographic process is the preferred process for forming circuitry on opposite sides of the web. In such a process, photoresist material is coated on both sides of the web and exposed to actinic radiation in the desired pattern, followed by a development of the exposed photoresist to reveal or transfer the pattern to the substrate. Following this, the circuitry is formed by conventional additive or subtractive plating processes which are not the subject of the present invention. Thus, it becomes necessary in this very early stage in the process to be sure that the exposed patterns are aligned within the allowable tolerances to provide their required degree of alignment. Such two-sided exposure has been attempted at the same station at the same time; however, this poses significant problems of attempting to expose both sides while chucking the material. However, attempts to do the two-sided exposure at separate stations at separate times has not proved entirely satisfactory as the circuit density increases due to the difficulty of providing the necessary alignment of the pattern on the second side of the web to the pattern previously exposed on the first side.

Therefore, it is a principal object of the present invention to provide a method and apparatus for exposing opposite sides of a web of material to actinic radiation for a lithographic process at spaced stations simultaneously with a close alignment of the exposed patterns on both sides necessary for fine circuitry formation.

SUMMARY OF THE INVENTION

According to the present invention, an apparatus and method of using same for exposing successive sections of opposite sides of a web of material to actinic radiation in patterns on each section of the opposite sides of the web is provided. The apparatus includes a first station having mechanisms to locate and expose selected sections on the first side of the web to actinic radiation in a first pattern, and a second station spaced from the first station having mechanisms to locate and expose selected sections on the second side of said web to actinic radiation. The first and second stations include first and second pattern masters and first and second mountings for the masters, and first and second sources of actinic radiation to project the desired patterns of exposure from each of the masters to each of the sections on the first and second sides of the web in very close registration or alignment thereof. Each of the stations includes a web locating device to locate the web and the master with respect to each other at each station, and each of said stations includes a mechanism to selectively maintain the master and web in a located position contacting each other during exposure, and a web transfer mechanism to periodically transport the sections to and from the stations. The invention also includes a program which uses fiducial marks on the masters and alignment devices on the web to provide a best fit of the master with the web at each location.

BRIEF DESCRIPTION OF THE DRAWINGS

FIG. 12 is a side elevational view partially in section of the plate of FIG. 11;

FIG. 13 is a sectional view taken substantially along the plane designated by the line 13—13 of FIG. 8;

DESCRIPTION OF THE PREFERRED EMBODIMENT

Figure 1A:
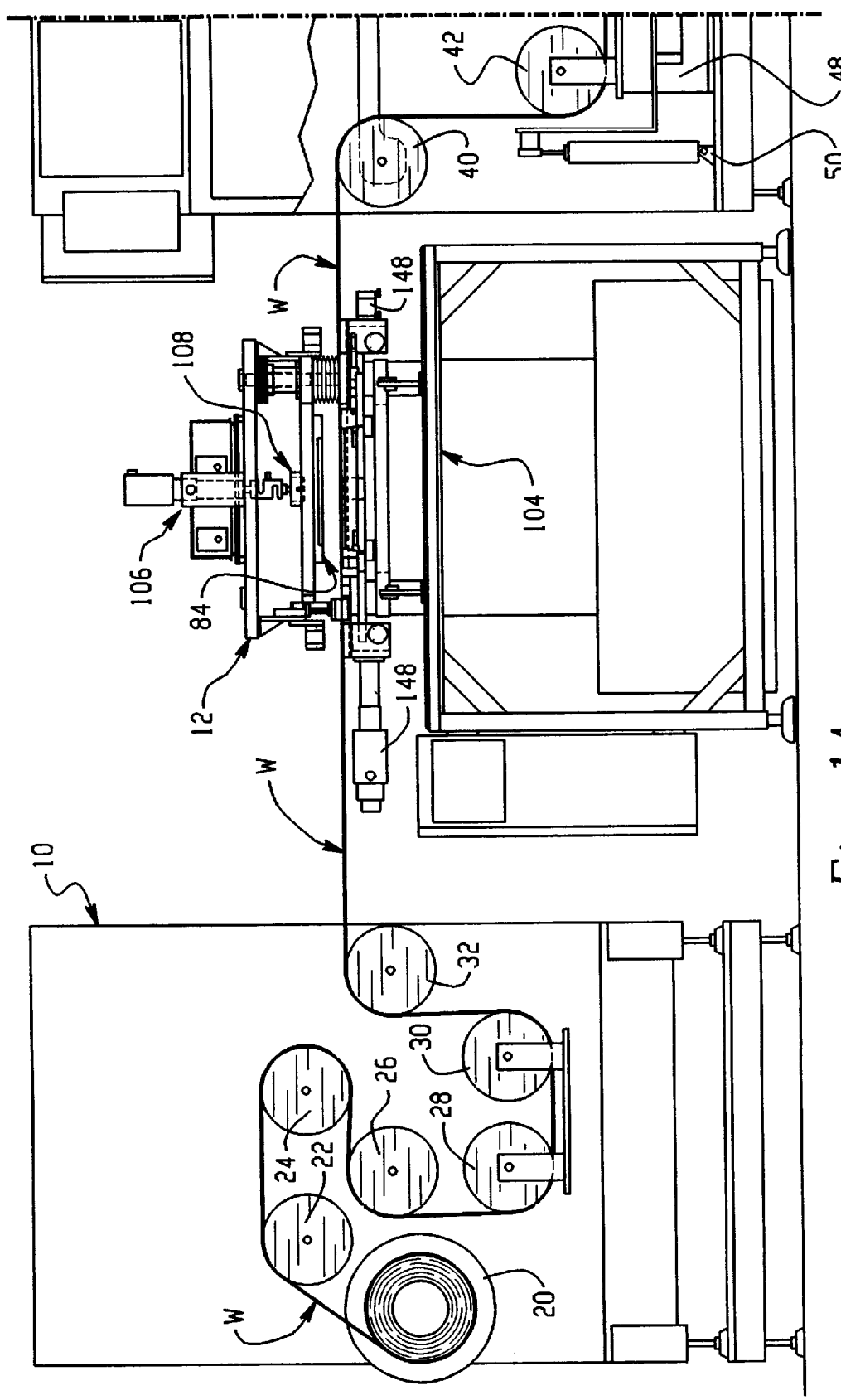
FIGS. 1A and 1B together constitute a side elevational view of the exposure tool of this invention.
Figure 1B:
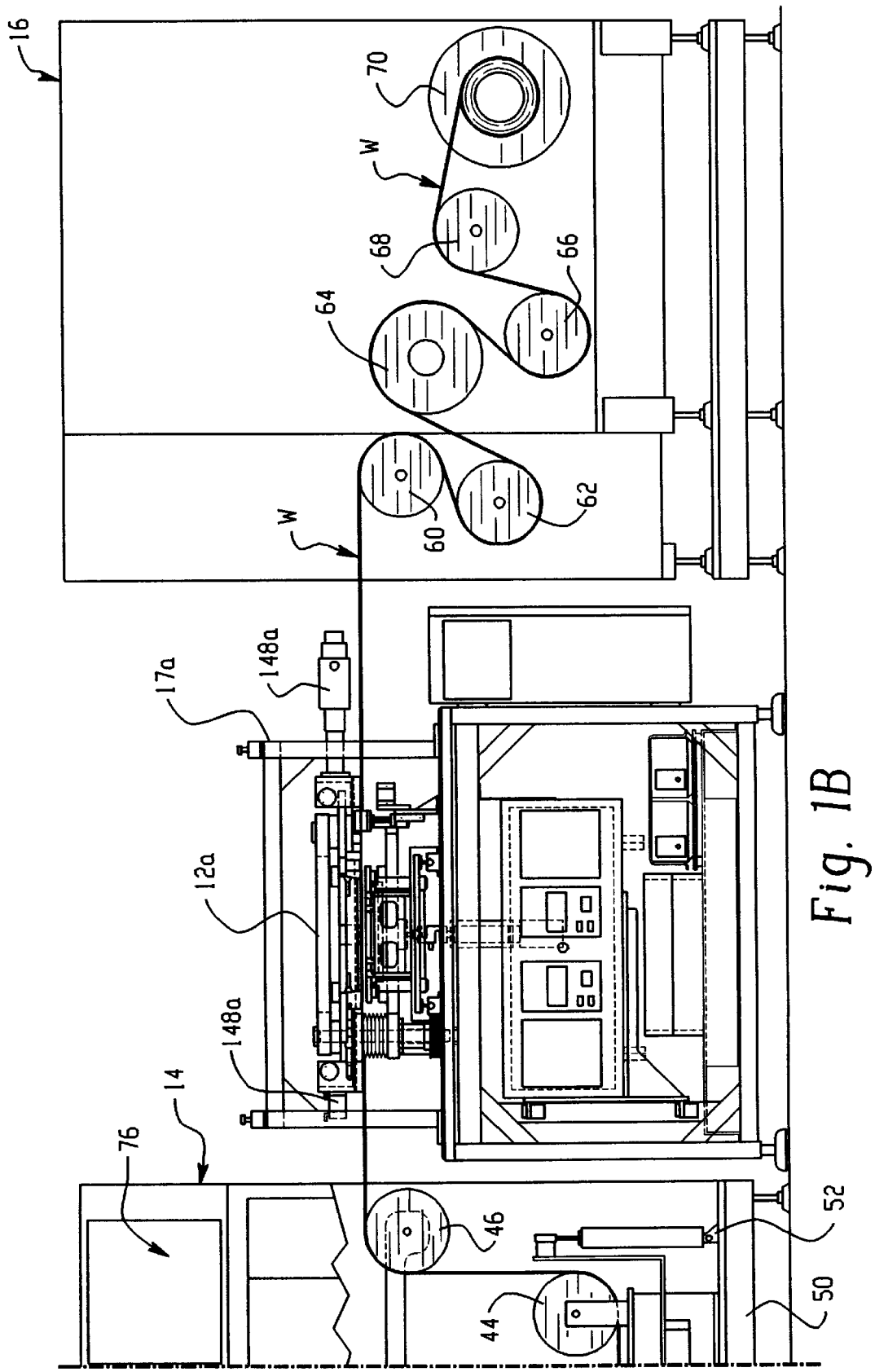
Figure 2A:
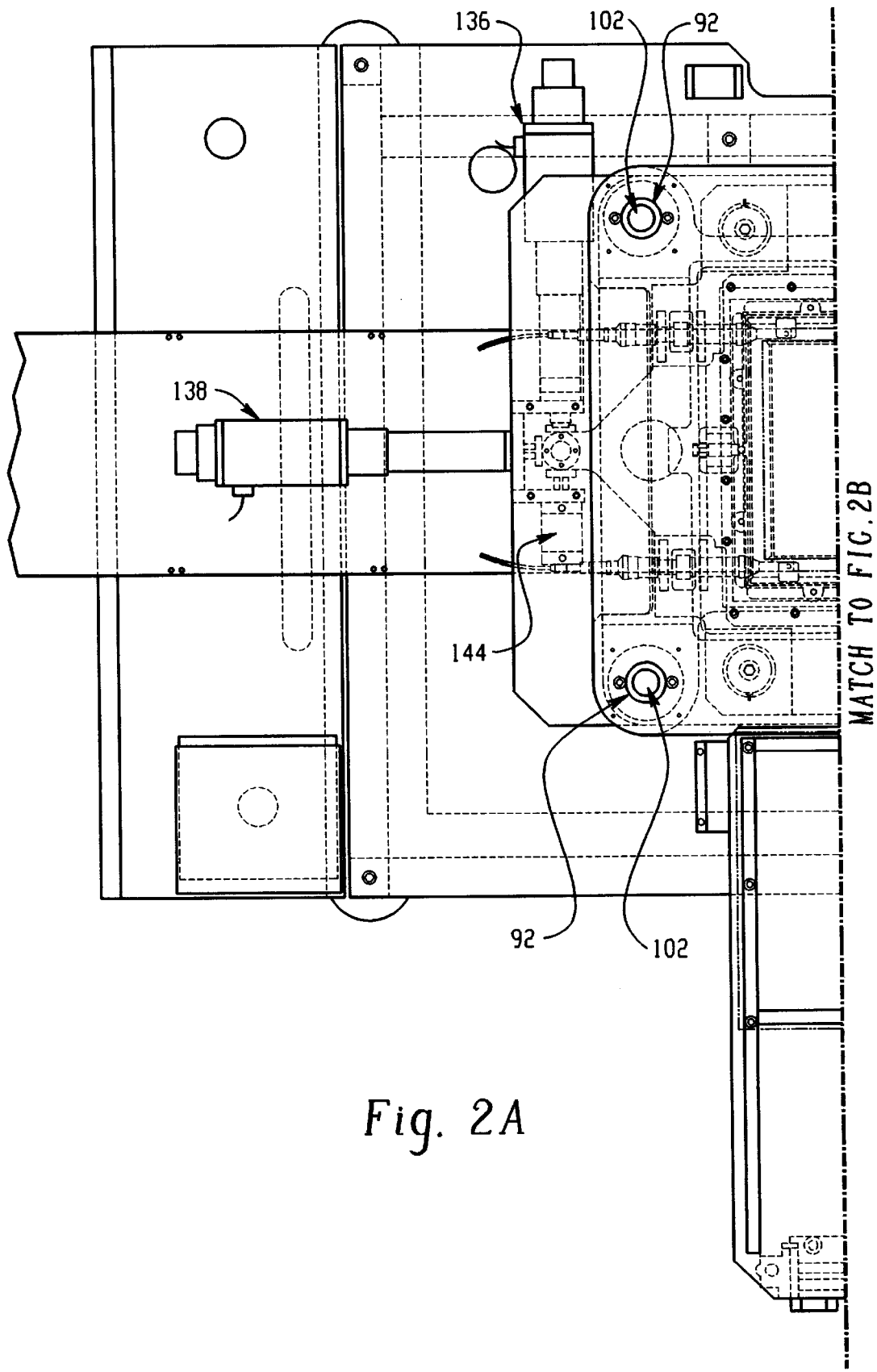
FIGS. 2A and 2B together constitute a top plan view of the bottom exposure station.
Figure 2B:
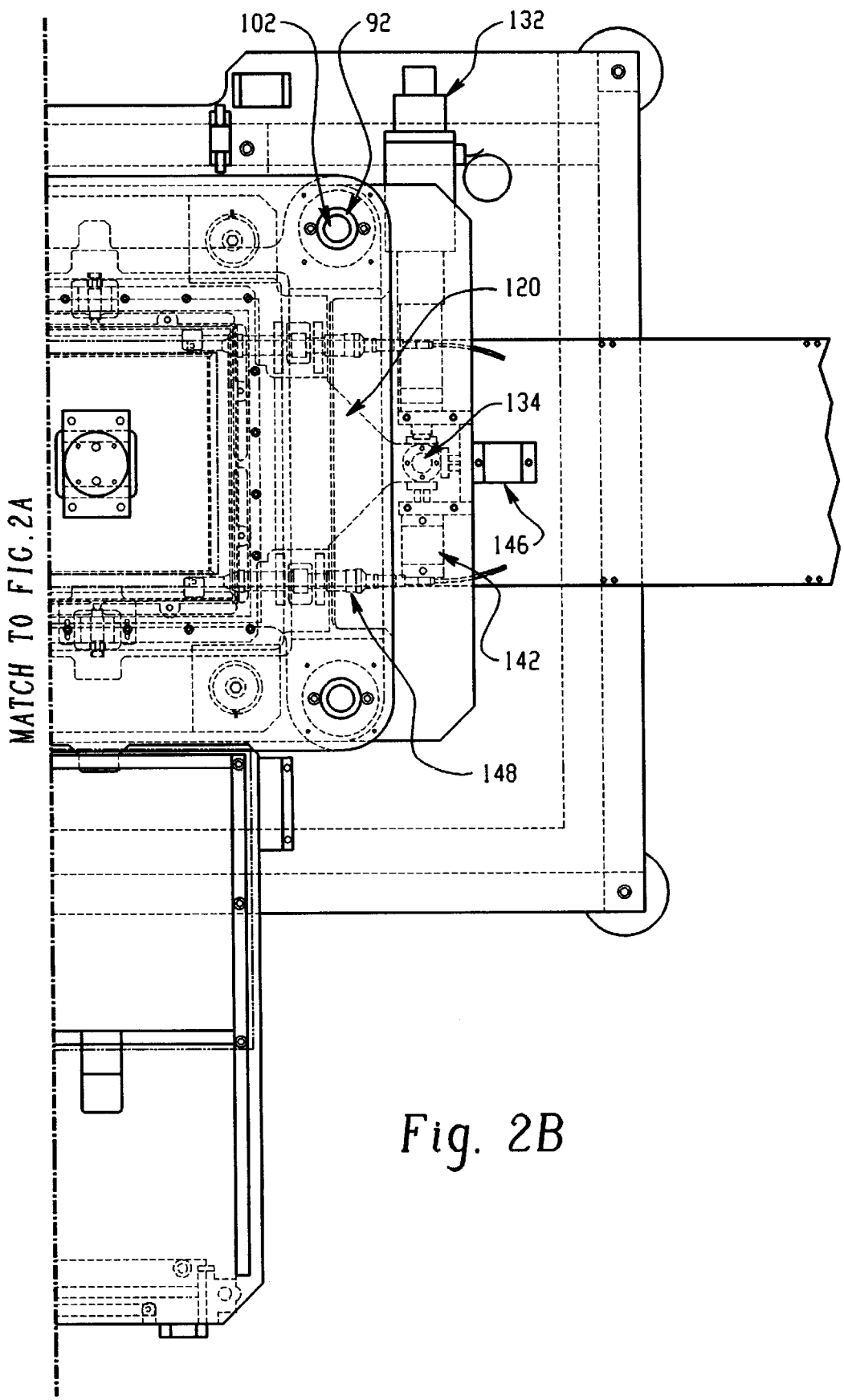
Figure 3:
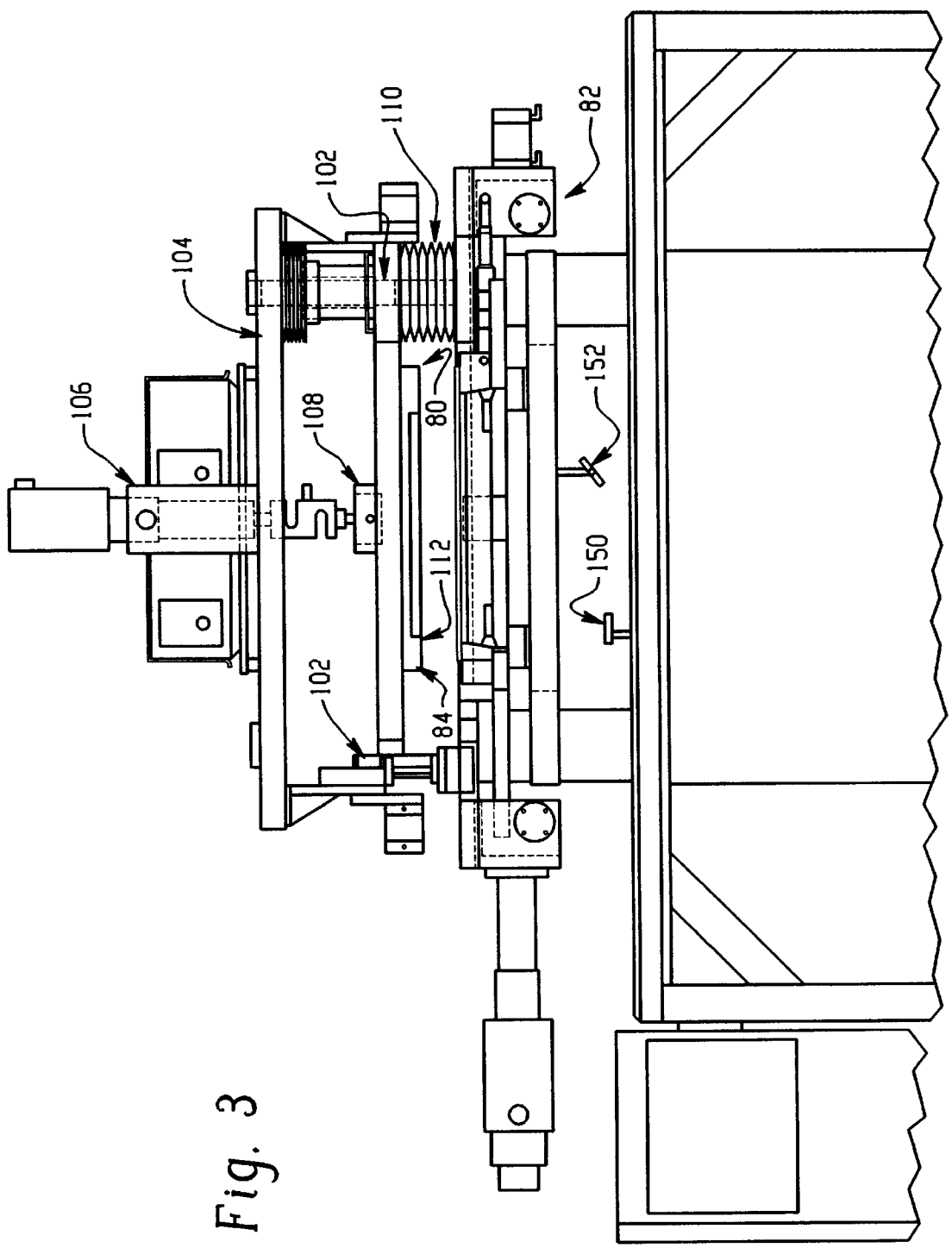
FIG. 3 is a side elevational view of the bottom exposure station.

Referring now to the drawings, and for the present to FIGS. 1A and 1B, a multiple station exposure tool for exposing opposite sides of a web of material to actinic radiation simultaneously on opposite sides at spaced locations is shown. The exposure tool includes a web feed station, generally designated as 10, a bottom exposure station 12, a pitch index control station 14, top exposure station 12a and a web take-up and tension control station 16. The bottom exposure station 12 and top exposure station 12a are substantially identical to each other, except that they are inverted with respect to each other, as will be explained presently.

The web feed station 10 includes a coil feed mounting 20 on which a web of material W is mounted. The web material W is fed from the coil feed mounting 20 through rollers 22, 24, 26, 28, 30, and 32 to the bottom exposure station 12 which is shown in its opening or web feed position. The rollers 28 and 30 are steering rollers and have a mechanism not shown, but known in the art, to adjust the feed of the web material W in the plane in which it is being fed to the bottom exposure station 12.

From the bottom exposure station 12 (which will be described in detail presently), the web of material W is fed through rolls 40, 42, 44 and 46 in the pitch index control station 14. The rolls 42 and 44 also are steering rolls and have associated linkage, also well known in the art, to steer the web of material W on the plane in which it is being fed to the top exposure station 12a. The rolls 42 and 44 are mounted on a roll mounting platform 48, which platform is connected to a pair of air cylinders 50, which in a well-known manner are used to control the pitch on the web of material W; i.e., for coarse registration of the holes H in the web W at bottom exposure station 12. This is accomplished by moving the platform 48 on which rolls 42 and 44 are mounted up or down, thus changing the pitch or registration of the web W at bottom exposure station 12 which maintains the pitch or registration at top exposure station 12a.

The web of material W is delivered from the roll 46 to the Lop exposure station 12a (shown in its closed or web clamping position and which will be described presently) and thence to the web take-up station 16. The web take-up station 16 includes rolls 60, 62, 64, 66 and 68, over which the web of material W is reeved onto a coil take-up mounting 70.

The web feed station 10 and web take-up and tension control station 16 are conventional in design, and the structures thereof do not constitute a part of the invention, per se. Therefore, in order to provide for clarity of illustration, the details of the structure of these stations are omitted, their structure and operation being understood to those skilled in the art.

Before discussing the structure of the bottom exposure station 12 and top exposure station 12a, it is believed that it would be useful to briefly review the function of these stations with a general overview of how they operate in conjunction with the web of material and the remainder of the exposure tool.

The purpose of the exposure stations 12 and 12a is to expose opposite sides of the web of material W (which has photoresist material laminated to both sides thereof) to actinic radiation to form patterns by conventional lithographic techniques. The stations 12, 12a are especially useful for photopatterning opposite sides of a web of material which is to be utilized to form flexible circuits, and thus following the photopatterning, the opposite sides of the material are developed and further processed by either additive or subtractive processes to form circuitry thereon, all as is well known in the art.

The circuitry on opposite sides of the web must be precisely aligned with each other; i.e., that the top and bottom circuitry must be in rather close registration. As technology advances and circuit lines become narrower and spaces between circuit lines become smaller, more and more precise alignment is required. It is the purpose and function of the top and bottom exposure tools 12, 12a to provide exposure to the top and bottom of the web of material so as to provide the necessary provision alignment of the top and bottom circuitry when it is formed, based on the exposed pattern; and this is accomplished in the present tool with exposure at the top and bottom taking place simultaneously, but at spaced locations, i.e., the top and bottom exposure stations 12 and 12a are spaced from each other, although exposure to top and bottom takes place simultaneously.

Figure 14:
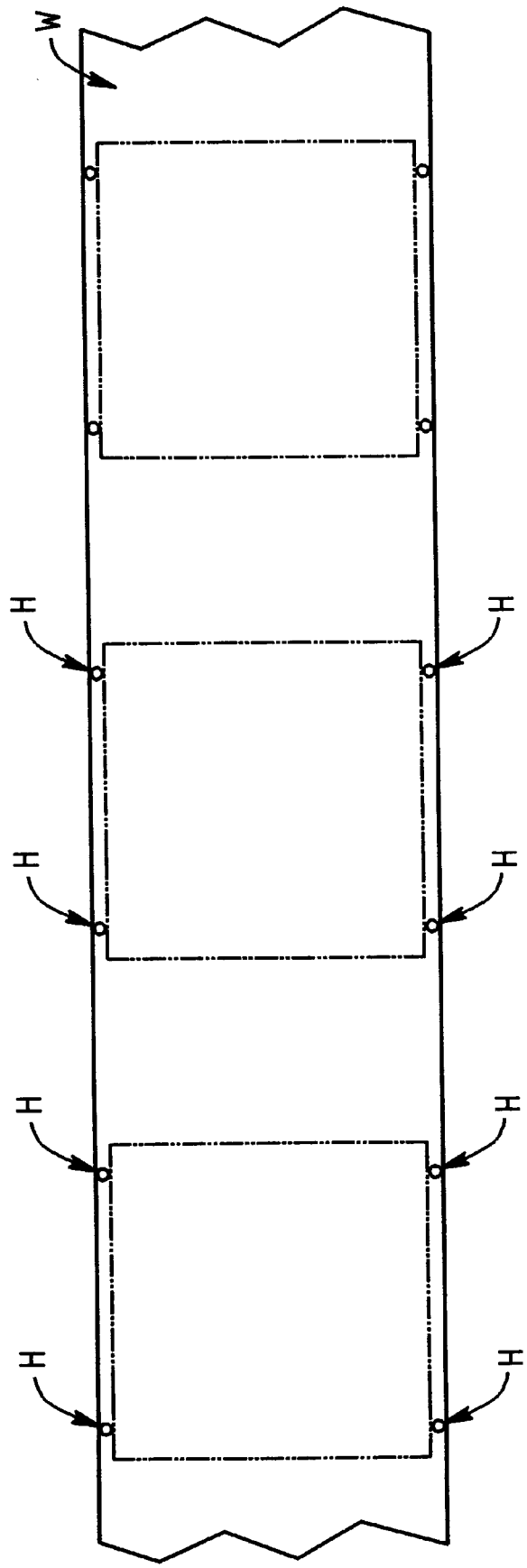
FIG. 14 is a plan view, somewhat diagrammatic, of a portion of a web.

In order to provide a precise alignment necessary, the web of material W is provided with openings therein arranged in a predetermined pattern at spaced locations therealong corresponding to the areas where the circuitry is to be formed. As shown in FIG. 14, the web of material W is provided with through holes H which preferably are arranged as shown in this depiction with four holes at each area of circuitry, these areas of circuitry being outlined in dotted outlines on FIG. 14. The holes act as the alignment device to which the master at the exposure stations 12 and 12a are aligned.

The web take-up station 26 moves the web of material W from the web feed station 10 to each of the exposure stations 12 and 12a to roughly position or register the web with respect to the master to which it is to be exposed. The web of material W is then chucked at each exposure station, and at each exposure station mechanisms are included to determine a best fit between the chucked web of material located at the station and the pattern on the pattern master which is to be exposed onto the particular side of the web. The "best fit" is determined by a computer algorithm (which will be described presently) and then the pattern master is moved in a frame to correspond to this "best fit" with respect to the web of material, after which the web of material is secured against the master and exposure takes place. The stations 12 and 12a also provide for correcting for any errors that may occur following the determination and adjustment for the best fit and the clamping, which errors could result from wrinkling or other irregularities in the web, and apply this correction to the determined best fit and come up with a "corrected best fit" before exposure actually takes place.

In order to accomplish this at each station, the web is first moved into close proximity with the master having the pattern thereon, the location of the holes in the web with respect to the fiducial marks on the master (which preferably is formed of glass) is determined, and a best fit is calculated. The master is then adjusted to the position of this "best fit", the web is then clamped between a vacuum chuck in the station and the master, and the best fit is again determined to see if it has remained or if correction is required. If correction is required, the correction is made to the originally calculated best fit by moving the master, and the web is reclamped and exposure takes place, following which the web is indexed to the next exposure position. It is to be understood that these operations take place at both the bottom exposure station 12 and the top exposure station 12a simultaneously so that exposure operations or sequences are taking place at each of these stations at essentially the same time. Since the alignment is being made on both top and bottom to the holes H in the web W, and since a "best fit" and "corrected best fit" are provided for both the top and the bottom of the web of material W, a good, precise match or registration between the patterns on the top and bottom surface of the web is obtained.

Turning now to the operation of the web exposure stations 12 and 12a, the structure and operation of the bottom exposure station 12 will be described in detail, it being understood that the top exposure station is substantially the same as the bottom exposure station, with the exception that the support members and the web exposure members are reversed, thus allowing the exposure to take place at the top rather than at the bottom. Since the structure of these two stations is essentially identical except for the reversal of their positions, the structure and operation of the top exposure station 12a will not be discussed in detail, with the parts thereof that correspond to the bottom exposure 12 being marked with the letter suffix "a" to indicate that they are part of the top exposure station.

Referring now to FIGS. 2A, 2B, 3 and 6–14, the bottom exposure station 12 includes a web support section 80 and a web exposure section 82. The web support section 80 includes a support member 84, which mounts a frame 86 supporting a flat porous material 88, which preferably is a block of $Al_2O_3$ which is formed in such a manner that it has sufficient porosity that a vacuum drawn on one side thereof and will operate through the material 88 to cause a vacuum on the opposite side and thus acts as a vacuum chuck. The support member 86 has four tabs 90, located at the four corners thereof, and in which are mounted bearings 92. Four light openings 94 are circumferentially arranged around the perimeter of the frame 86 and have a transparent glass therein which will allow light to shine therethrough. The light openings 94 are arranged to correspond to the holes H in the web of material W (FIG. 14), which will thereby allow light to shine through the light openings 94 and through the holes H in the web W and onto the fiducial marks on the glass master as will be described presently.

The frame 86 has vacuum connections 98 thereon. The frame 86 has a supporting lip 100 (FIG. 7) on which the block of material 88 is supported; and the block of material 88 is adhesively bonded by epoxy to the support lip 100.

The bearings 92 mount the support member 84 for sliding movement on posts 102 which extend from support base 104. A drive motor 106 is connected to the support member 84 by connection 108 which allows the frame 86 to be moved toward and away from the web exposure section 82. Bellows 110 protect the posts 102.

The purpose of the web support section 80 is to secure, by vacuum, the web of material thereto for movement toward and away from the web exposure section 82 and to position and clamp the web of material W in the proper alignment position against the glass master (to be described presently) during the alignment operation and while the exposure is taking place, and thereafter be free to move or index to the next station by removing the vacuum. The frame 86 also is provided with an elastomeric seal 112 around the periphery thereof to seal against the master as will be explained presently. Light is provided to the openings 94 by means of four fiber optic bundles 114 secured to the top of support member 84.

The web exposure section 82 includes a master mounting plate 120 on which a glass master 122 is mounted. The glass master 122 has art work thereon in the pattern to be exposed on the bottom of the web W when it is clamped against the glass master by the support member 84. The glass master 122 is maintained on the master mounting plate 120 by means of vacuum which is applied through vacuum openings 124 connected to vacuum channels 126.

Figure 10:
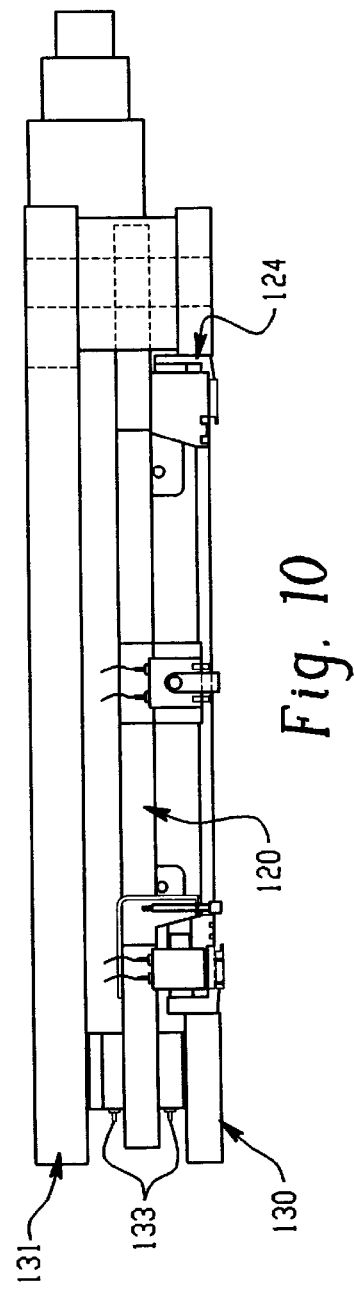
FIG. 10 is an end elevational view of the glass holder of FIG. 8.
Figure 11:
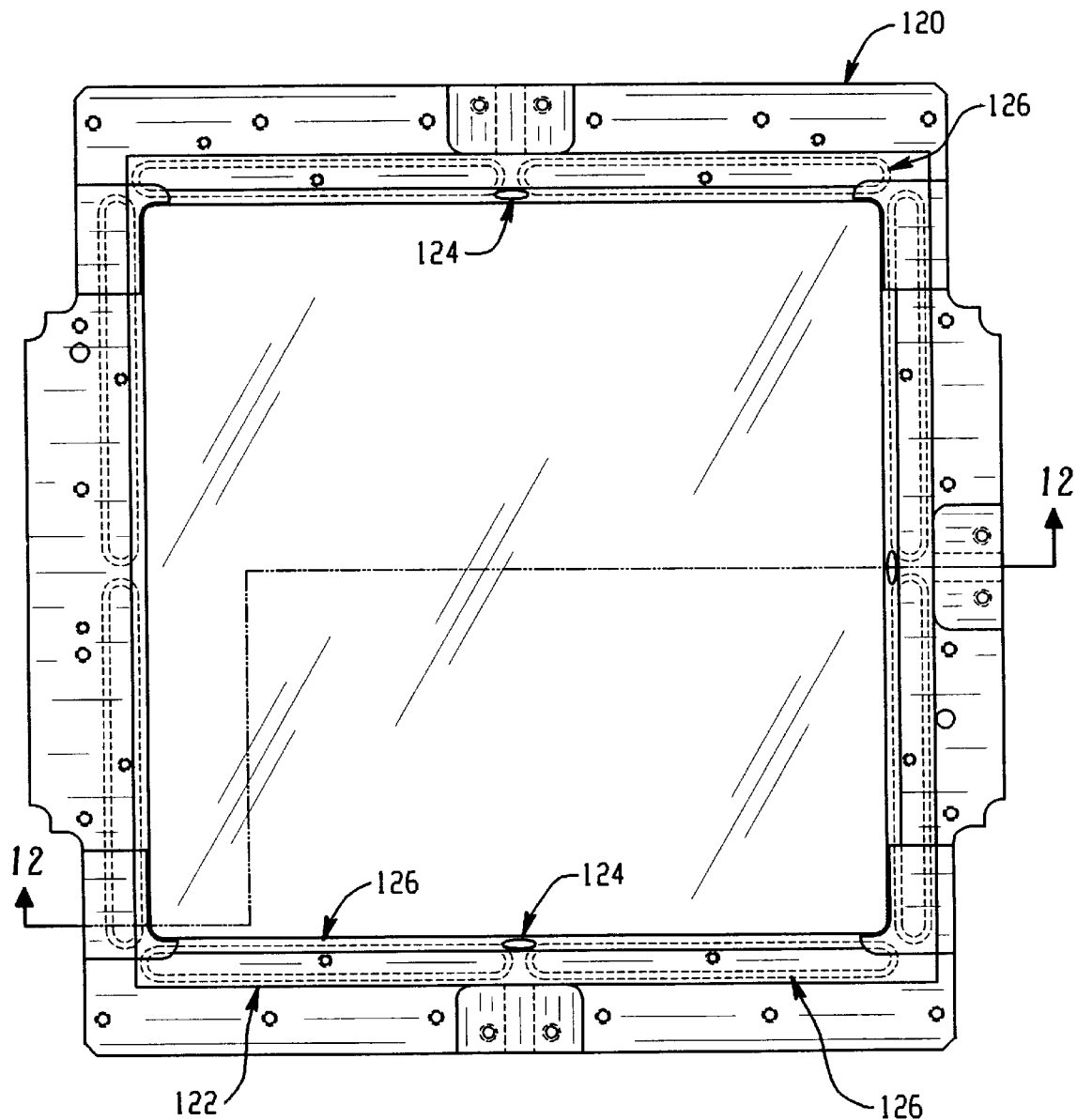
FIG. 11 is a plan view of a plate holding the glass master.

The master mounting plate 120 is mounted for movement in the X, Y and υ planes by virtue of the plate 120 being mounted between a lower support plate mounting frame 130 and an upper support plate mounting frame 131. The glass master plate 120 is supported between the frames 130 and 131 by air bearings 133 (FIG. 10).

An adjustment motor 132 is provided which is attached to the master mounting plate 120 through bearing 134 for movement of the plate 120, and thus the glass master 122. Two additional motors 136 and 138 are also provided which drive the master mounting plate 120. Reaction cylinders 142, 144 and 146 are provided which, in a well-known manner, balance the action of the adjustment motors 132, 136 and 138, respectively. Four cameras 148 are provided, one adjacent each fiducial mark on the glass plate to receive the projection of the fiducial marks and outline of the holes H as illuminated through the openings 94 in the support member 84 and holes H in web W.

A UV light source 150 and mirror 152 are disposed beneath the master mounting plate 120 and actuatable to provide the necessary UV radiation exposure to the bottom surface of the web through the glass master 122 in a well-known manner. All of the motors and other actuating devices are controlled by a computer controller (not shown). A pair of monitors shown at 76 are connected, one to the camera 148 and one to cameras 148a for displaying the fiducials and holes. This allows the operator to visually check alignment of the fiducials and holes, as will be described presently.

The operation of the bottom exposure station 12 (and the top exposure station 12a also) is as follows. When the take-up station 16 has indexed the web W to the approximate position required for exposure of the bottom surface in the bottom exposure station 12 (and also approximately for the proper positioning of the web W at the top exposure station 12a), with the support member 84 separated or in the open position with respect to the glass master 122 and with the vacuum off or the $Al_2O_3$ blocks 88, thus allowing the web W to move, the vacuum connection 98 to vacuum openings 96 is actuated, thus pulling the web tight against the plate member 88 due to the porous nature of the $Al_2O_3$. This will firmly chuck the web of material against the block 88. The drive motor 106 then is actuated to drive the frame 86 toward the web exposure station 82, with the web firmly chucked against the block of material 88. When the web of material W is in close proximity to the glass master 122, the movement of the support member 84 is halted and light is shown through the light openings 94 from light sources 114. The web of material W will be in contact with the light openings 94 with the holes H aligned therewith, thus allowing light to pass through the holes H in the web of material W onto the glass master 122. The glass master is provided with four fiducial marks (FIGS. 16 and 17) which act as locating indicia to locate the web W for exposure.

As indicated above, because of the very fine line width and close spacing between the lines, a very close fit is required between the web and the pattern to be projected thereon, and for many applications of this fine nature, the location cannot be afforded by the web moving devices. Therefore, as one aspect or the present invention, a best fit algorithm is provided within the computer which, based upon the location of the holes projected in the web with respect to the fiducial marks, calculates a "best fit" of these four marks. (This algorithm will be described presently.) The support frame 130 is then moved in the X, Y and υ (υ is sometimes referred to as T hereinafter) planes by actuating the motors 132, 136 and 138. By actuation of these motors, the master mounting plate 120 can be moved on the air bearings in the X, Y and υ direction until a best fit is achieved. This movement is under the control of the computer which calculates the best fit in a manner to be described presently.

Once the best fit has been achieved, the motor 106 is again actuated to move the chuck toward the glass member to clamp the web W against the glass master 122. (This position is shown in the exposure station 12a.)

The seal 112 around the glass master provides an airtight seal between the support member 84 and the glass master 122 and, hence, a second vacuum region of the chuck extending out of the web W will be drawn by the chuck will also draw a vacuum between the glass master 122 and the web W, drawing the glass master 122 tightly against the web W. The light is again illuminated through the light openings 94 through holes H and with the fiducial marks on the glass master 122. The alignment with the fiducial marks is determined and compared with the "best fit" previously determined. If, because of wrinkling, crimping or some other defect, the best fit is not achieved or for some reason is determined to be other than as calculated, the support member 84 is moved away from the glass master to move the web W out of contact with the glass master 122, and the error which has been measured is corrected by the computer by moving the motors 132, 136 and 138 to provide the necessary correction, and the web is again clamped against the glass master for exposure with the seal 112 sealing to provide the vacuum, and the exposure is made by radiation source 150 and mirror 152. Once the exposure has been made and the vacuum holding the web W to the support member 84 is relaxed, air is blown through the vacuum lines and the drive motor 106 drives the support member 84 away from the glass master 122 and the web W is then advanced to the next exposure site.

Figure 4A:
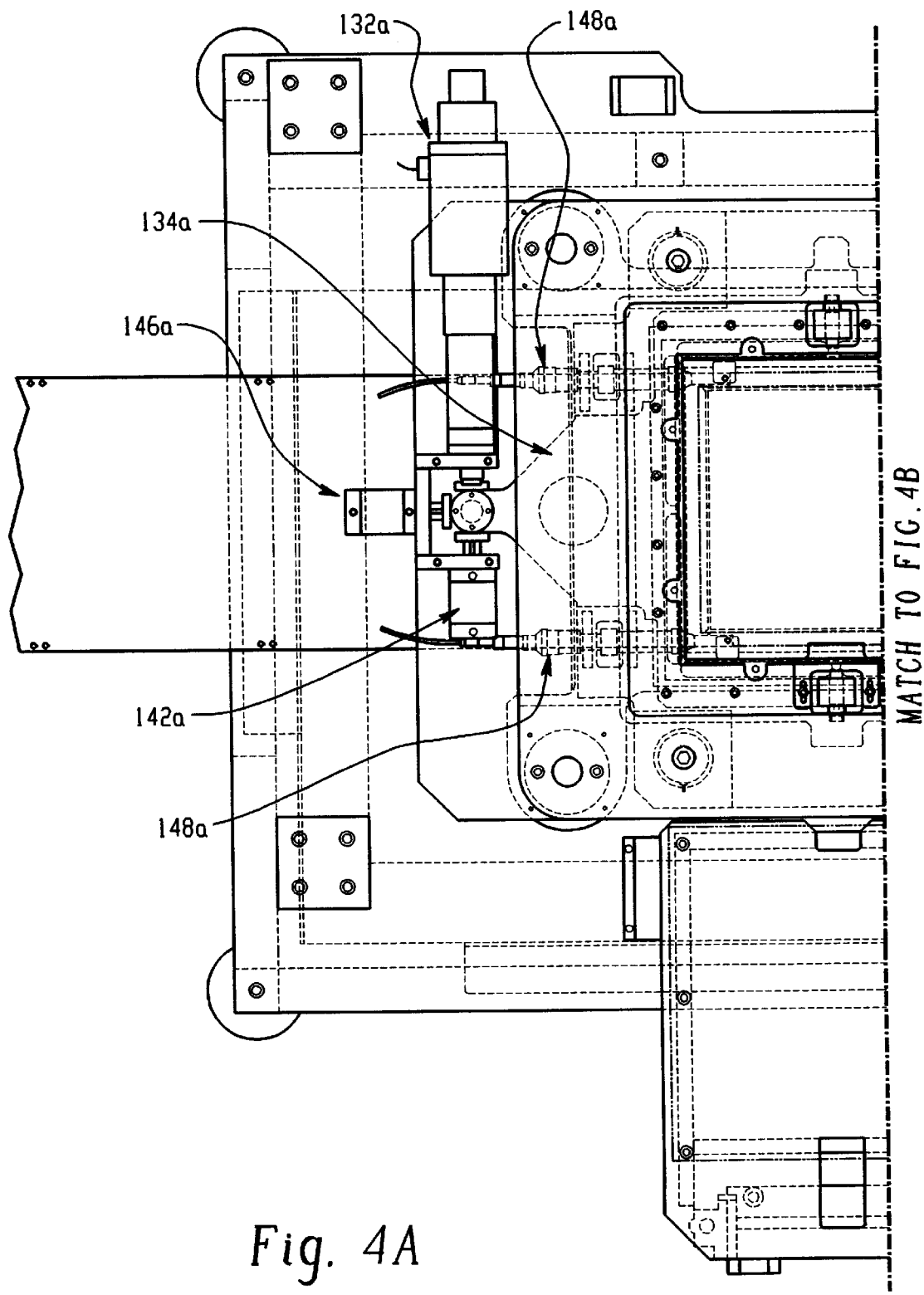
FIGS. 4A and 4B together are a top plan view of the top exposure station.
Figure 4B:
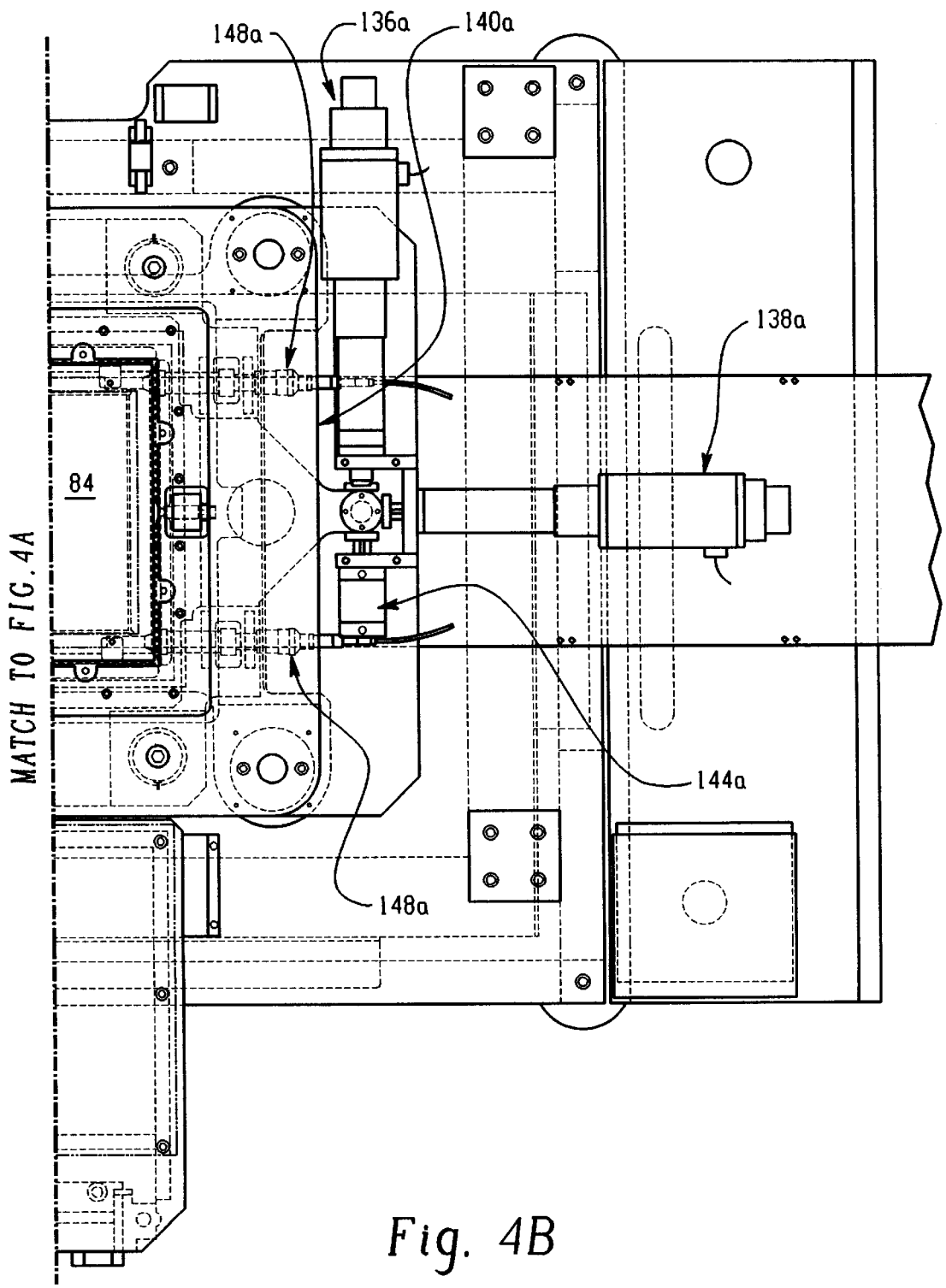
Figure 5:
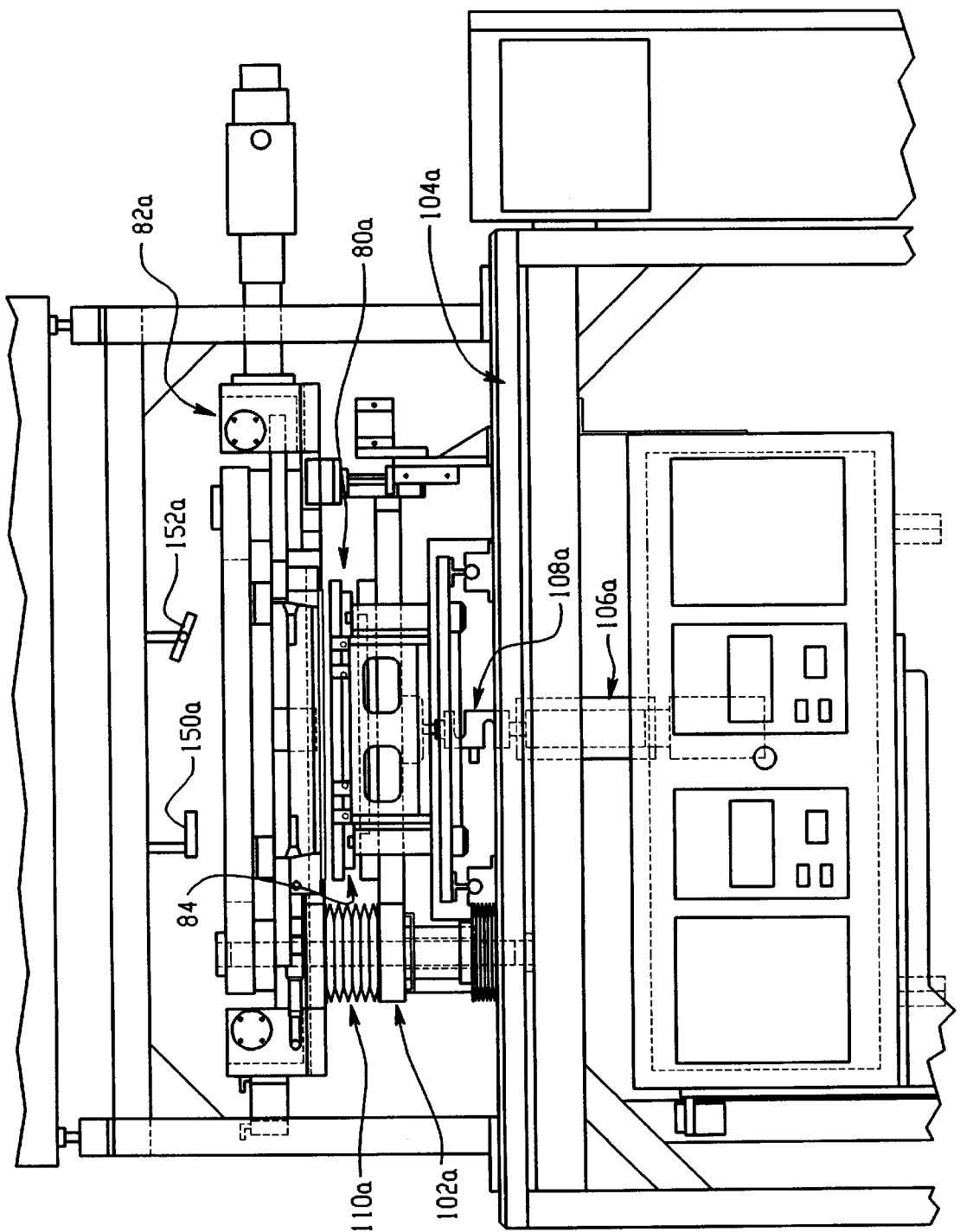
FIG. 5 is a side elevational view of the top exposure station.
Figure 6:
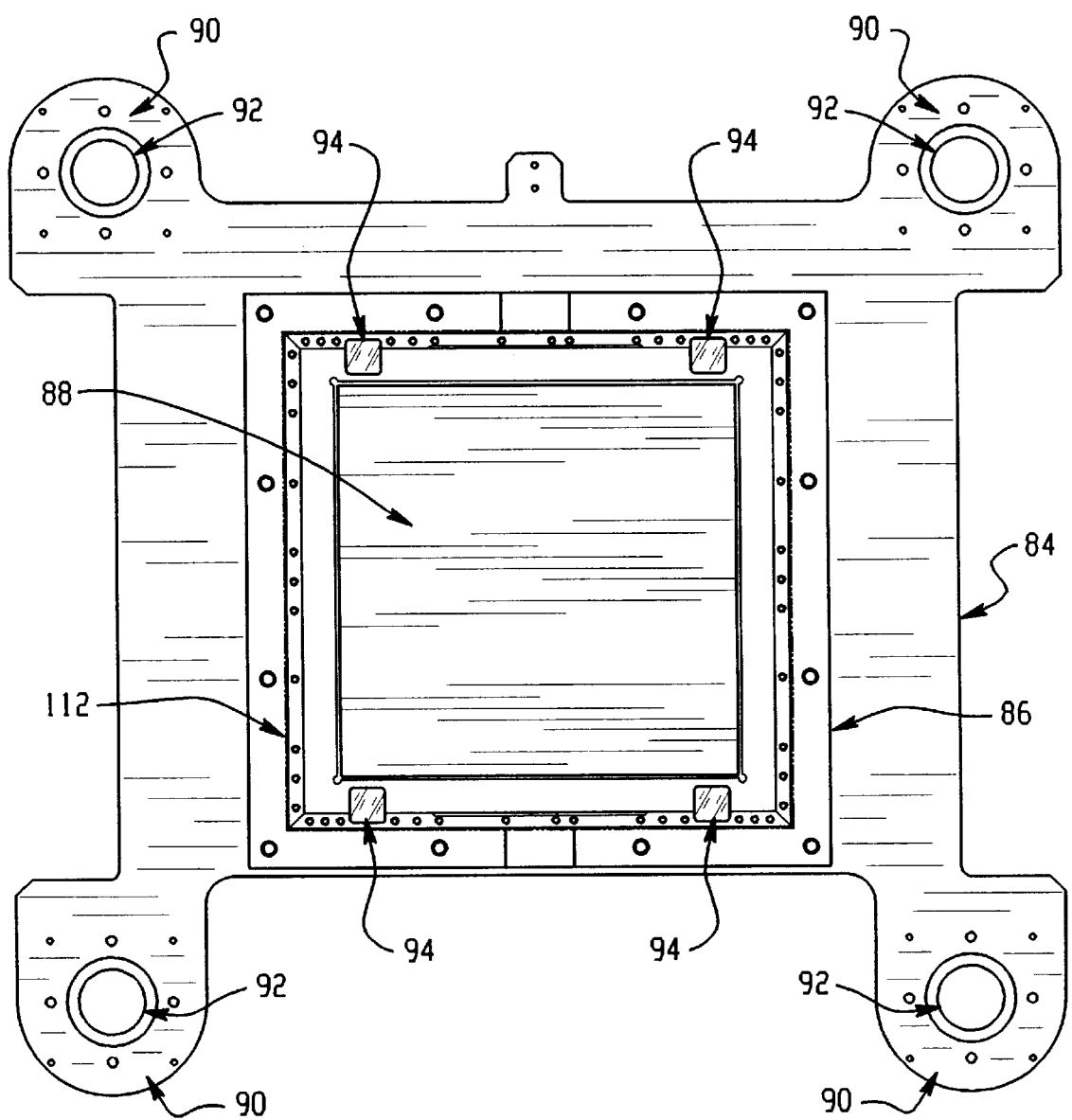
FIG. 6 is a top view of a chuck used in the top exposure station.
Figure 7:
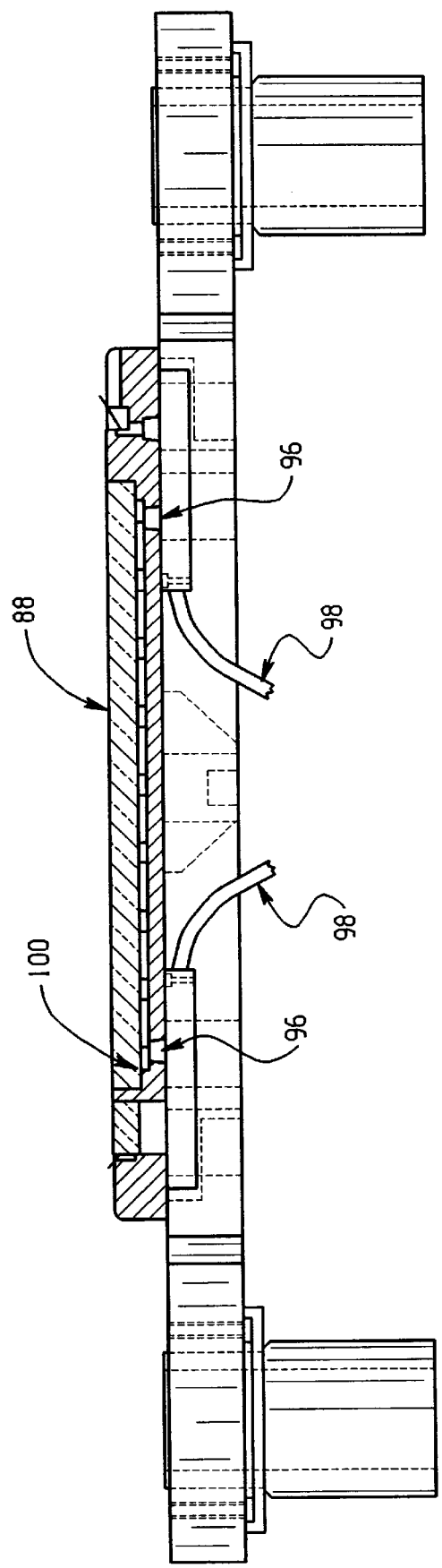
FIG. 7 is a sectional view of the chuck shown in FIG. 6.
Figure 8A:
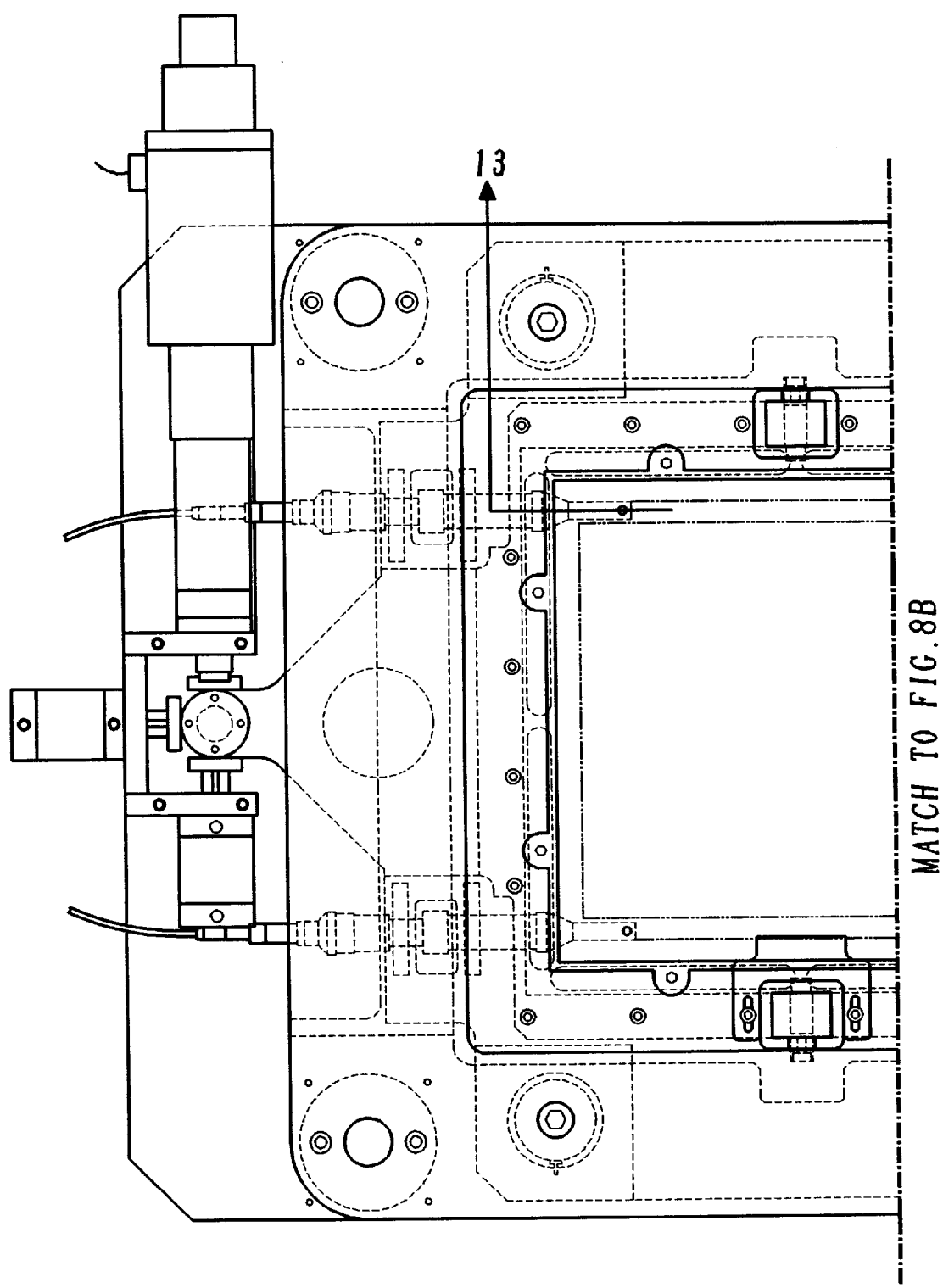
FIG. 8 is a plan view of a web exposure station of the bottom exposure station.
Figure 8B:
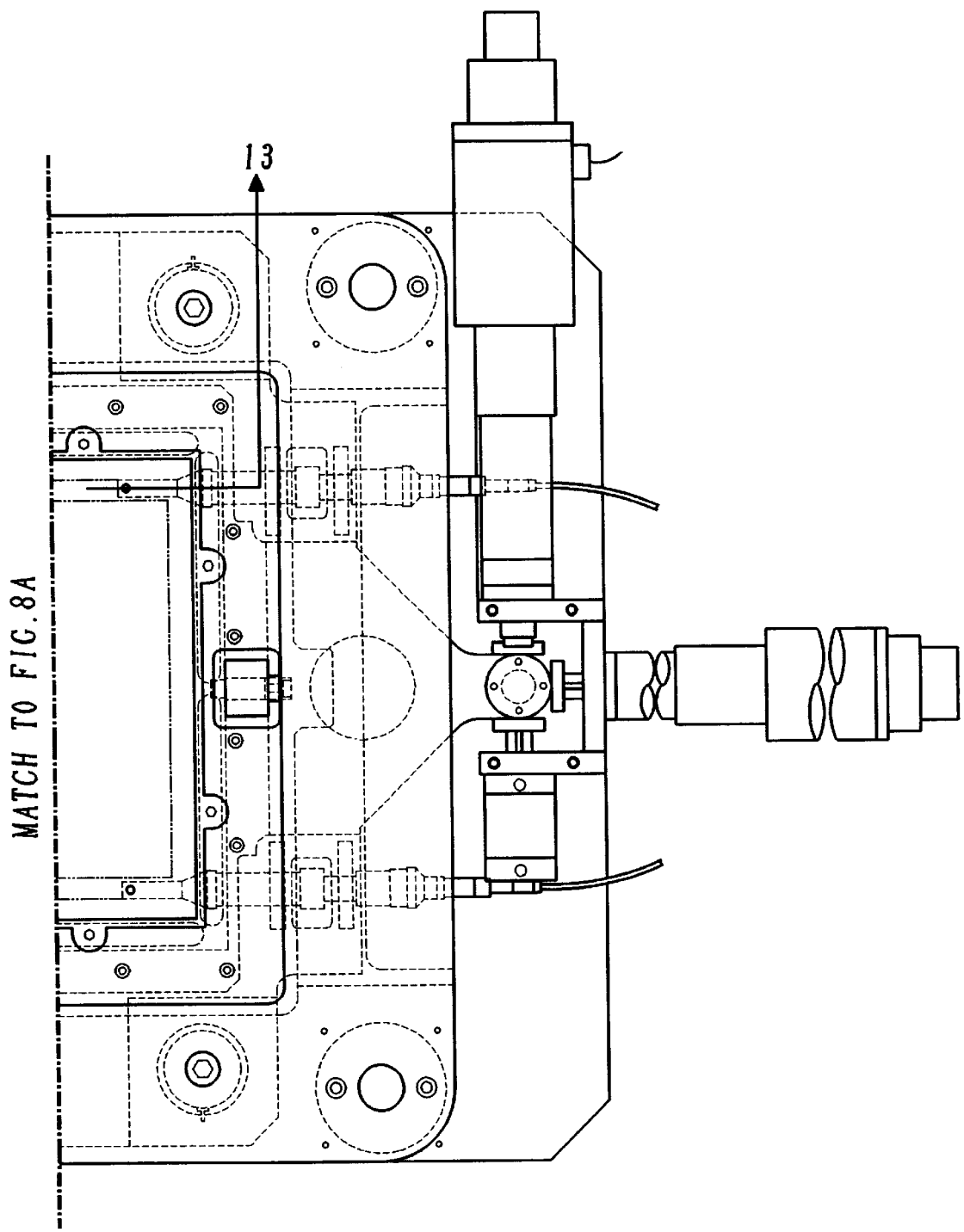
Figure 9:
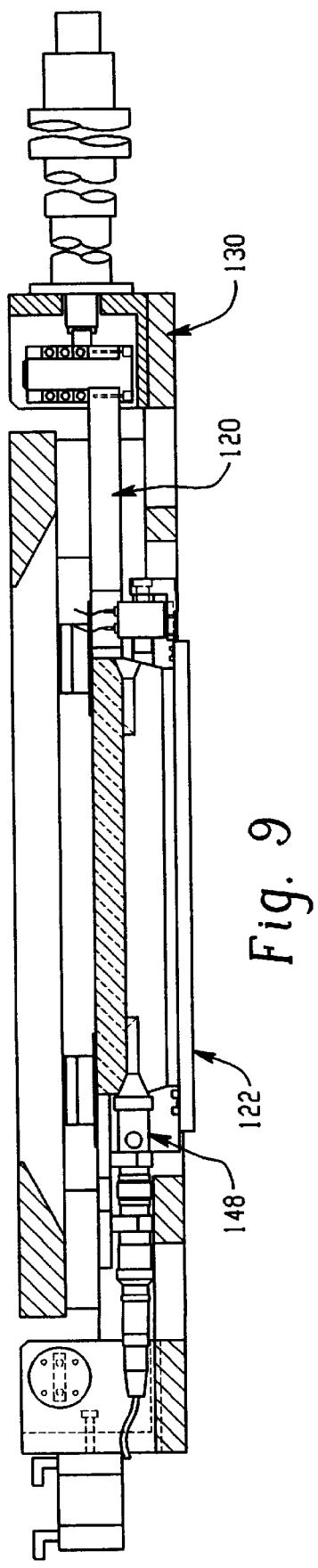
FIG. 9 is a side elevational view partly in section of the glass holder station of FIG. 8.

It should be understood that at the same time that the exposure sequence, i.e., the alignment and exposure, is taking place at the bottom exposure station 12, the same thing is happening at the top exposure station 12a (shown in FIGS. 4A, 4B and 5) and need not be described in detail. However, it is important to note that the exposure sequence at both stations 12 and 12a are taking place simultaneously so that at each indexed position an exposure is made to both the top of the web W and the bottom of the web W, and exposure is being made at spaced stations. Moreover, the ability to expose at spaced exposure stations can be accomplished because of the precise alignment that is possible using the "best fit" algorithm and the ability to move the glass masters 122 and 122a in the X, Y and υ planes.

It should also be understood that a web splicing station (not shown) can be incorporated in the line between the web feed station 10 and the bottom exposure station 12 which will facilitate the continuous operation.

As indicated earlier, a best fit algorithm is used to determine the best fit of the web in relationship to the fiducial marks on both the top and the bottom glass masters 122 and 122a. This algorithm operates as follows.

Figure 15:
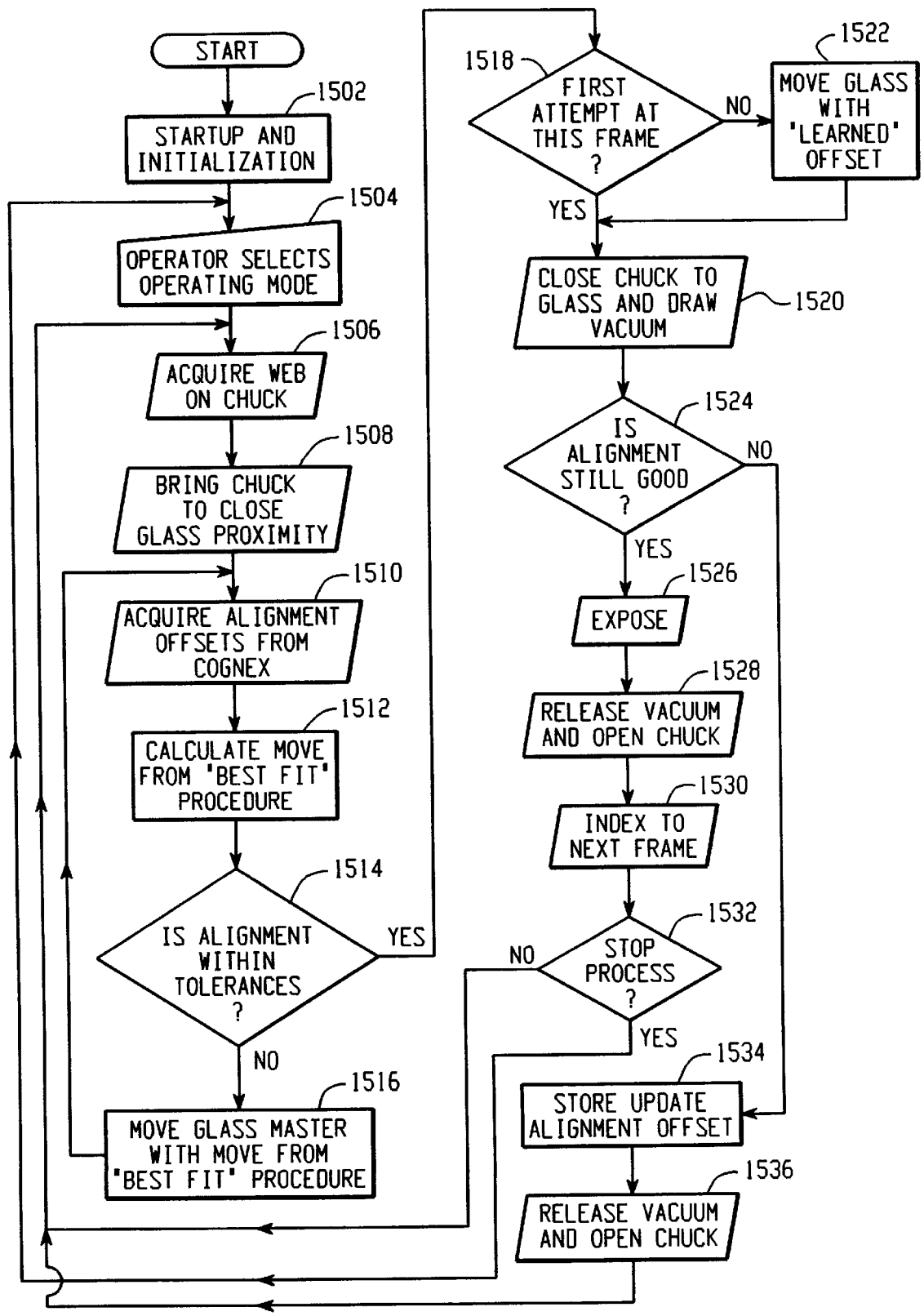
FIG. 15 is flowchart of the overall operating system procedure.

Referring now to FIGS. 2A–3, 6–13 and 15, a computer or programmable logic controller implementable flowchart 1500 illustrating the procedure, or operation, of the present invention will now be described. It is to be understood that the operational steps described and shown in FIG. 15 are under computer control, and the necessary control signals are inputted by input devices well known in the art (not shown) to the various motors and operation components. The procedural description described herein will reference various physical components of the present invention with the understanding that the procedure is applicable to the general operation of each exposure station. The procedure begins in step 1502 where a startup and initialization process is performed. The startup and initialization process sets all of the system variables to their assigned startup values and checks for equipment error indications. After startup and initialization is complete, the procedure advances to step 1504 where an operator selects an operating mode. The operating modes include, among others, Full-Auto Run and Single Step mode. The Full-Auto Run mode will be described hereinafter in greater detail. The Single Step Mode allows the system to "step " through the individual steps of the process. For example, in the Single step mode, one may perform the individual steps of acquiring, the aligning and/or exposing the web without performing every step in the process. The Single Step mode is especially helpful for trouble-shooting and debugging purposes.

When the operator selects a "Full-Auto Run" mode, the procedure advances to step 1506 where the web W is acquired on chuck 84. To recall, the purpose of the chuck 84 is to secure, by vacuum, the web of material thereto for movement toward and away from the web exposure section 82 and to position and clamp the web of material W in the proper alignment position against the glass master during the alignment operation and while the exposure is taking place, and thereafter be free to move or index to the next station by removing the vacuum. After step 1506, the chuck 84 is brought to a close proximity of the glass master 122 in preparation for step 1510.

In step 1510, the procedure acquires the alignment offsets by employing a vision system for determining distances from the fiducials to the product holes. The preferred embodiment employs a COGNEX vision system manufactured by COGNEX CORPORATION. The COGNEX vision system determines the relationships, (e.g. distances) between the fiducials on the glass master 122 and the product holes. The position data is then fed to a computer where a "Best Fit" procedure processes the data and determines motor movement parameters. To recall, when the web of material W is in close proximity to the glass master 122, the movement of the chuck 84 is halted and light is shown through the light openings 94 from light sources 114. The web of material W will be in contact with the light openings 96 and with the holes H aligned therewith, thus allowing light to pass through the holes H in the web of material W onto the glass master 122. The glass master 122 is provided with four fiducial marks (FIGS. 16 and 17) which act as locating indicia to locate the web for exposure. The four cameras at 148, one adjacent each fiducial mark on the glass plate, receive the projection of the fiducial marks and outline of the holes H as illuminated through the openings 94 in the chuck 84 and holes H in web W. Based upon the location of the holes projected in the web with respect to the fiducial marks, an alignment offset value is calculated with X and Y component for each fiducial mark and hole.

After the alignment offsets are acquired, in step 1510, the motor move parameters (i.e. alignment corrections) are calculated via the "Best Fit" procedure in step 1512. The "Best Fit" procedure will be presently discussed in greater detail in the text associated with FIGS. 16–27. Once the alignment corrections have been calculated in step 1512, the procedure advances to step 1514.

In step 1514, the alignment corrections is tested to determine whether they are within specified tolerances. The specified tolerances are the maximum distances from the fiducials to the product holes that are permitted by the product specifications. If the alignment offset is not within the specified tolerances in step 1514, the procedure advances to step 1516. In step 1516, the glass master 122 is moved based on the calculated alignment corrections. Once the glass master 122 is moved in step 1516, the procedure loops back to step 1510 where a new alignment offset is acquired via the COGNEX vision system. The procedure will continue to loop until, in step 1514, the alignment corrections are within the acceptable tolerances.

If the alignment corrections are within the acceptable tolerances, in step 1514, the procedure advances to step 1518. In step 1518, the procedure determines whether this is the first attempt at alignment of the current frame. If so, the procedure advances to step 1520 where the chuck 84 closes to the glass master 122 and a vacuum is drawn to seal the assembly. After step 1520, the procedure tests the alignment in step 1524 to ensure that the movements of step 1520 have not caused the alignment to exceed the acceptable tolerances. Step 1524 includes an acquisition step similar to 1510 where the COGNEX vision system acquires the alignment offset.

If the alignment is still within the specified tolerances in step 1524, then the procedure advances to step 1526. In step 1526, exposure is made by radiation source 150 and mirror 152. Once the exposure has been made, the procedure advances to step 1528 where the drive motor 106 drives the chuck 84 away from the glass master, and the vacuum holding the web W to the chuck 84 is released and the web W is then advanced to the next exposure site, or alternatively, out of the exposure mechanism, in step 1530. After step 1530, the procedure tests whether the exposure process should stop or proceed to the next frame. If the process should be stopped, then the procedure loops back to step 1504 where the operator selected operating mode will govern when the exposure process should start or continue. If the process should continue in step 1532, then the procedure loops back to step 1506 where the web is once again acquired on the chuck and so on.

If the alignment is has been disturbed so as to no longer be within the specified tolerances in step 1524, the procedure advances to step 1534. In step 1534, the acquired alignment offset is stored for use subsequent use in the "Best Fit" procedure. After step 1534, the procedure advances to step 1536 where the chuck 84 is driven away from the glass master 122, and the vacuum holding the web W to the chuck 84 is released. After the web W has been released in step 1536, the procedure loops back to step 1506 where the web W is once again acquired on the chuck and the alignment process proceeds until proper alignment (i.e. within specified tolerances) is achieved.

Figure 16:
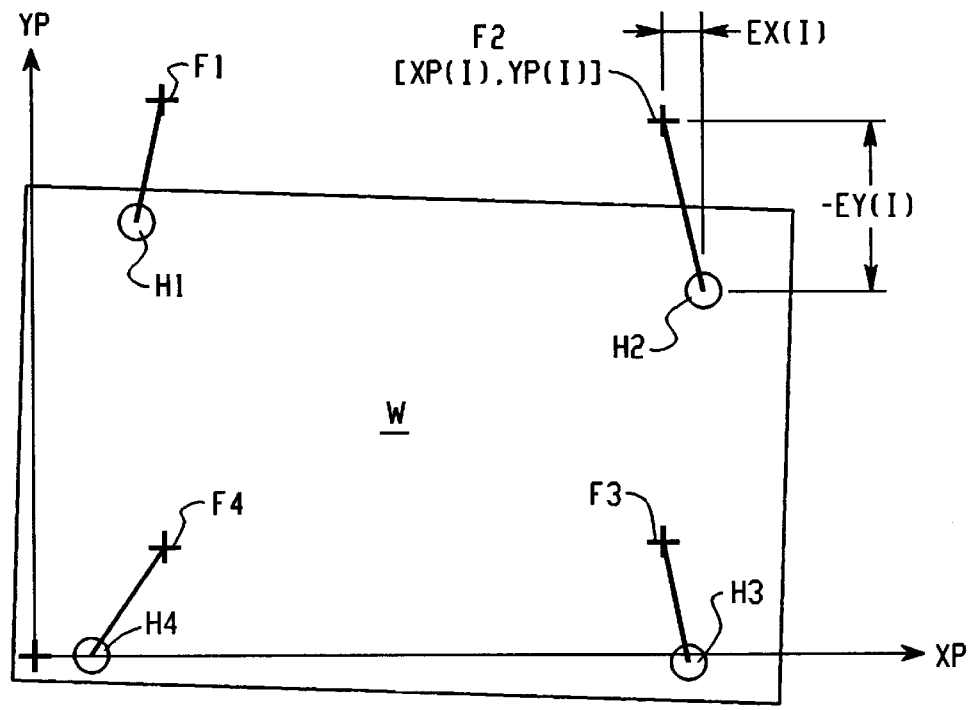
FIGS. 16 and 17 are illustrations showing product alignments before and after application of the "Best Fit" procedure.
Figure 17:
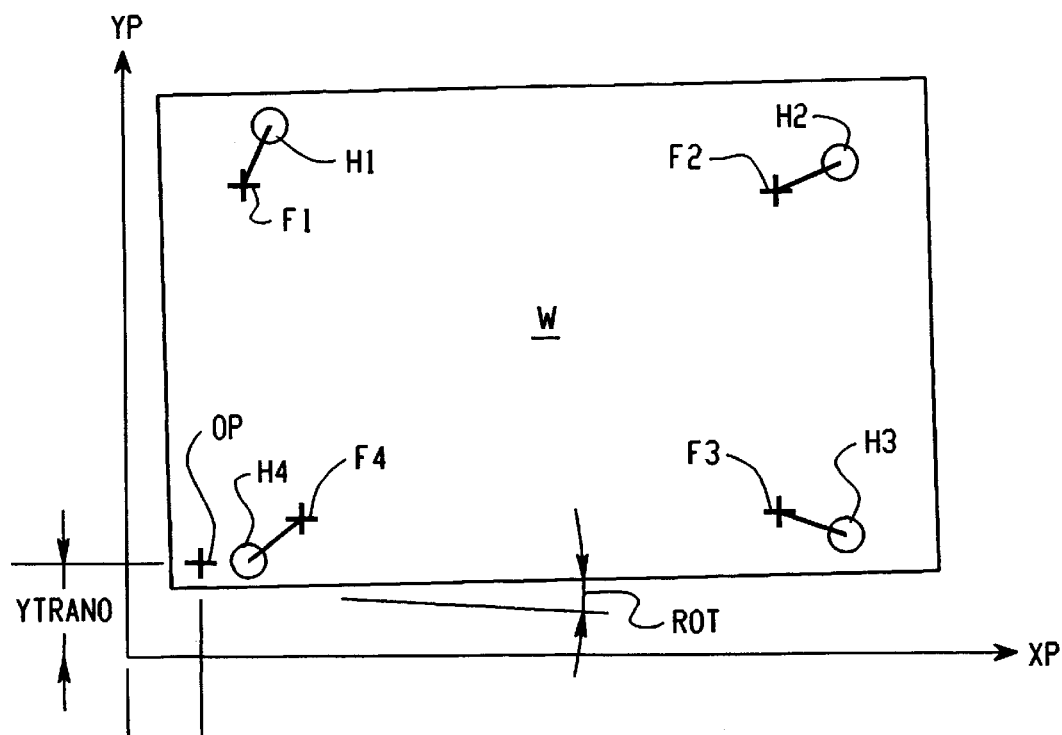

Referring now to FIGS. 16 and 17, an overview of the "Best Fit" procedure will be presented as applicable to portion of web W. In particular, FIG. 16 shows a web W with features on it in some starting relation to a stationary axis XP and YP also with correspondingly fixed features on it. The features of the web W include product holes H1–H4 and a home point OP. The fixed features associated with the stationary axis XP and YP include fiducials F1–F4. The inputs to the "Best Fit" procedure are the nominal locations of the fiducials F1–F4 with respect to the stationary axis, e.g. XP(I), YP(I) for fiducial F2, and the relative distances therefrom to the holes H1–H4. For example, fiducial F2's distance from hole H2 is shown as EX(I), -EY(I).

In general, the "Best Fit" procedure of the present invention minimizes the maximum radial error present between an apparatus and a fixed alignment designation. The use of the term "radial error" or "radial distance" hereinafter includes the meaning of a vector having a length and a direction from a designated center point. Additionally, while the "Best Fit" procedure has and will be illustrated with respect to a portion of web W, it should be apparent to those skilled in the art that it may be applied to any part, tool, or apparatus. Before discussing the particulars of the "Best Fit" procedure, a overview of the an alignment task is appropriate.

More specifically, consider the task of aligning an imperfect part to a tool. The locations of the fixed features on the tool can be thought of as nominal positions and the relative distances to the features on the imperfect part as errors. The task of aligning the imperfect part to the tool requires a translation and rotation of the imperfect part so as to minimize the errors in some fashion. Most "registration" techniques use a "least squares" best fit algorithm. These "least squares" algorithms employ well-known regression formulas and therefore are not difficult to implement. However, it has been determined that the above mentioned techniques result in a maximum radial error that is greater than that generated by the "Best Fit" procedure of the present invention. The "Best Fit" procedure of the present invention translates and rotates the imperfect part so as to minimize the maximum of all radial errors (hereinafter ER(I)). In general, there will be radial errors after alignment because the part is imperfect and will not "fit" over the nominal locations of the alignment tool exactly. Any reference to rotating or translating a part include the steps of a computer or programmable controller device generating an output signal which will control an actuator or positioning device to effectuate the desired rotation or translation. Such interfaces are well-known in the art and are widely available from a plurality of commercial providers.

Referring now to FIG. 17 in particular, the web W after the "Best Fit" procedure has been applied is shown. The outputs of the "Best fit" procedure are the X and Y translation, shown as XTRANO and YTRANO, and the rotation ROT required to minimize the maximum radial errors. As mentioned above, there will still be maximum radial errors, however, they have now been minimized.

Figure 18:
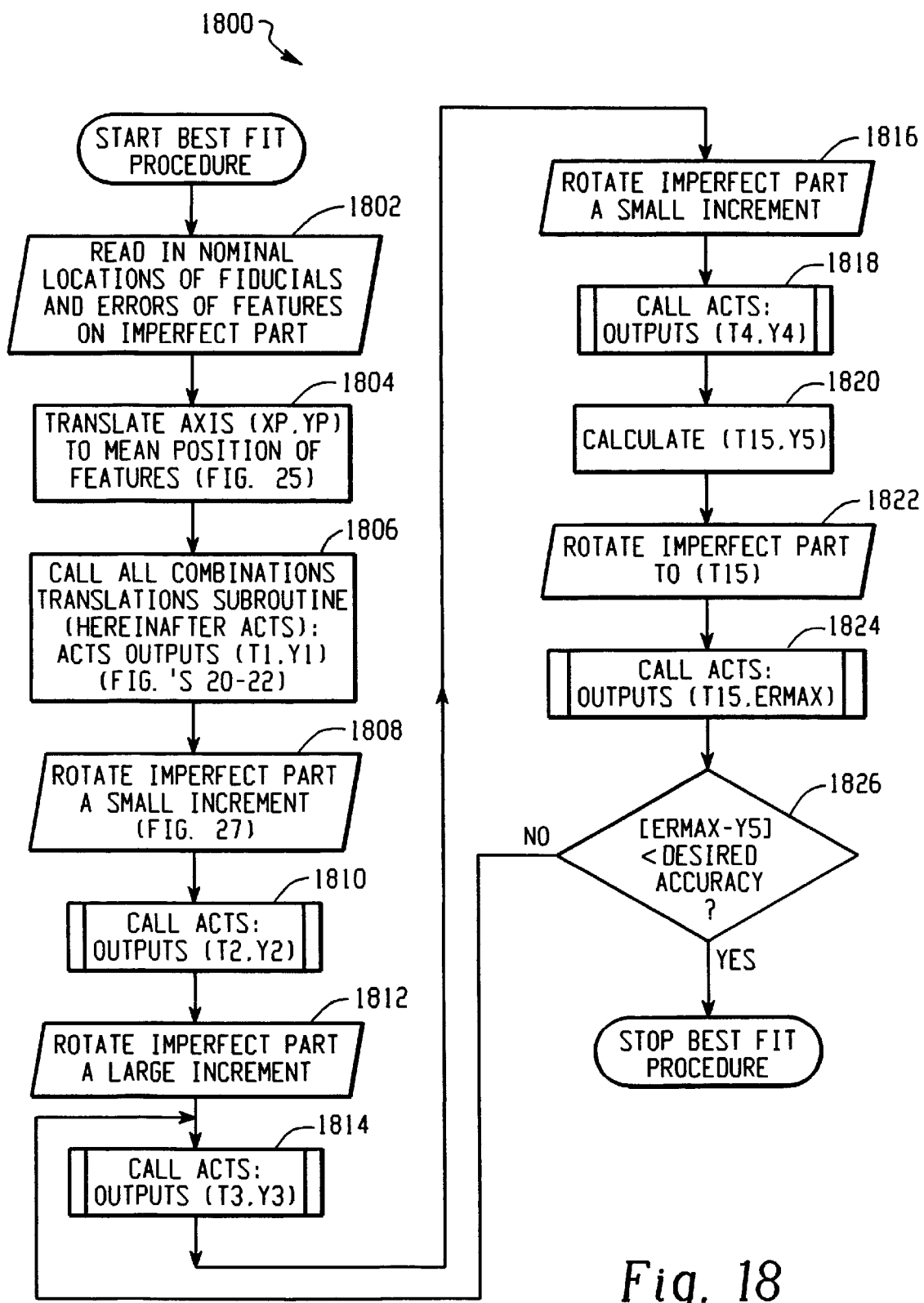
FIG. 18 is a flowchart illustrating the "Best Fit" procedure of the present invention.
Figure 19:
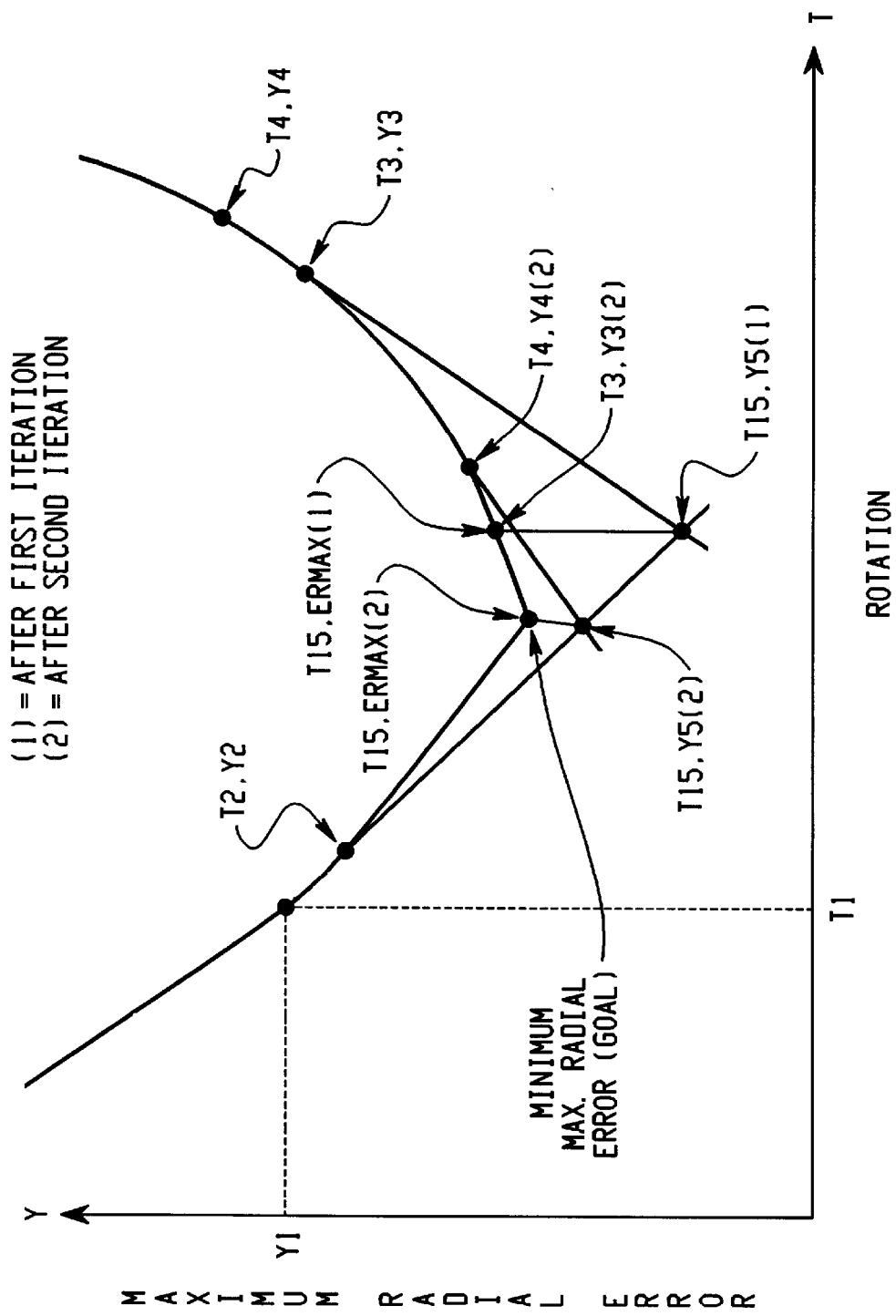
FIG. 19 is graphical illustration of how the maximum radial error varies with rotation of the fiducials or product features.
Figure 20A:
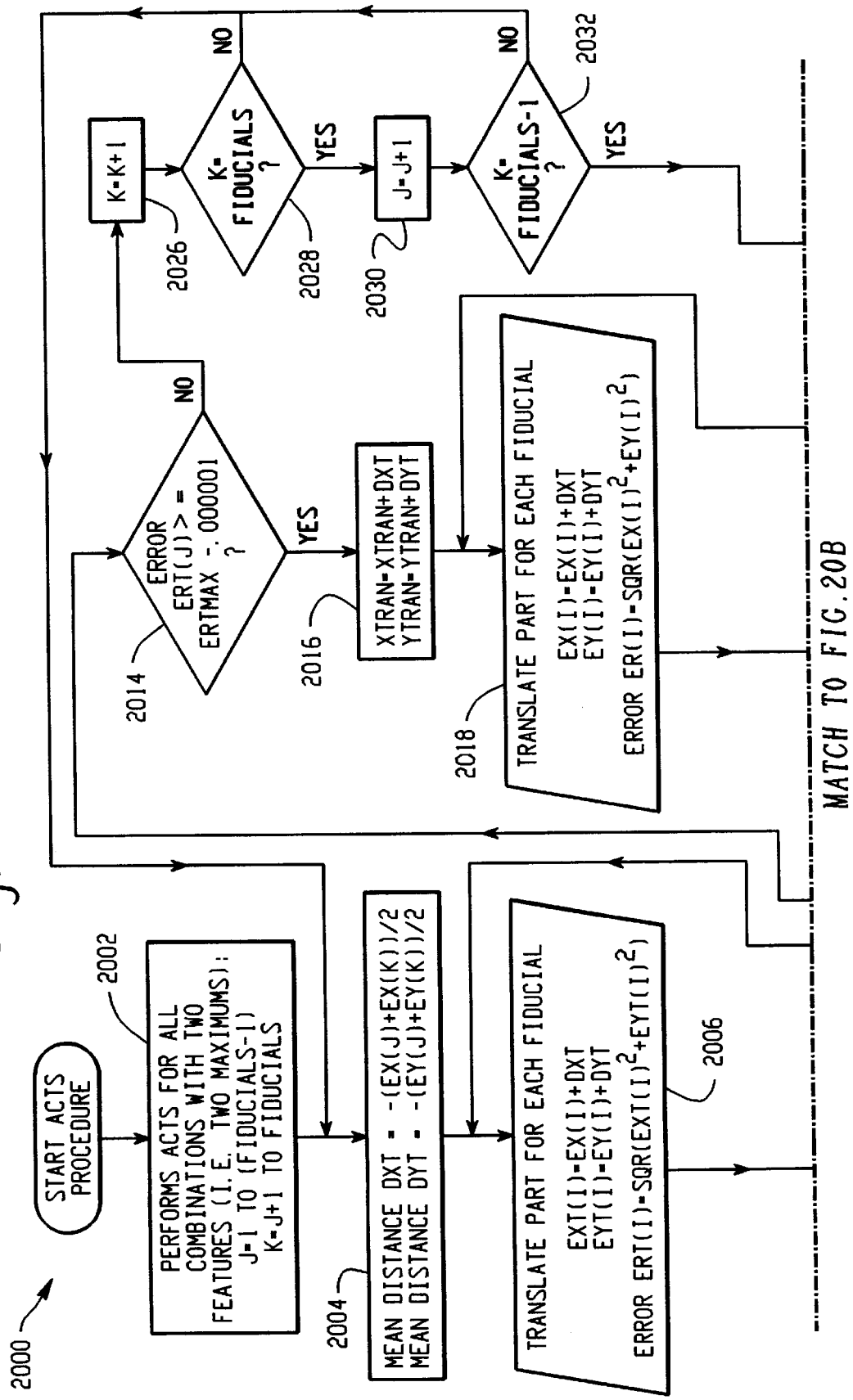
FIGS. 20–22 are flowcharts illustrating the All Combinations Translation Subroutine (ACTS) of the "Best Fit" procedure.
Figure 20B:
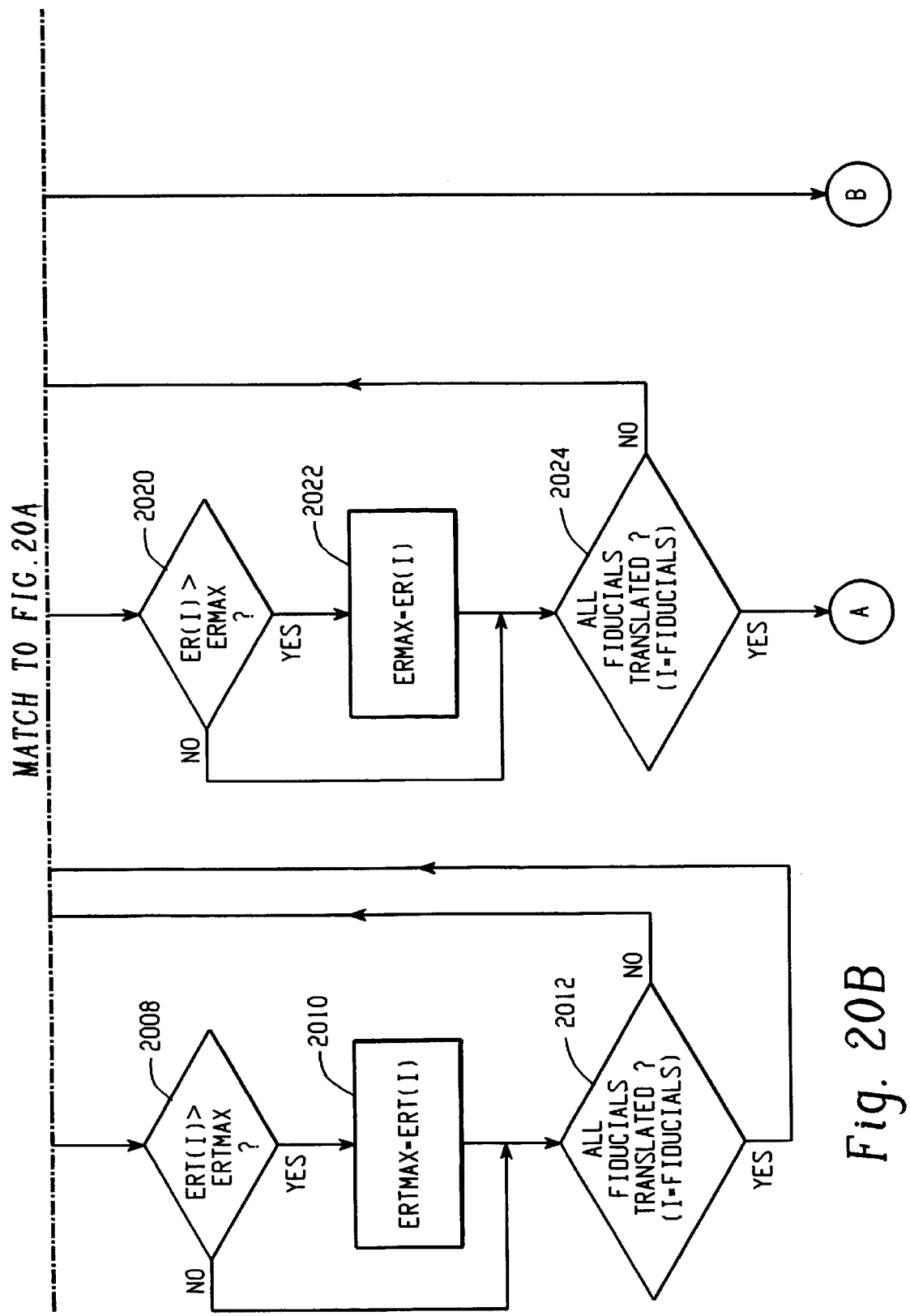
Figure 21A:
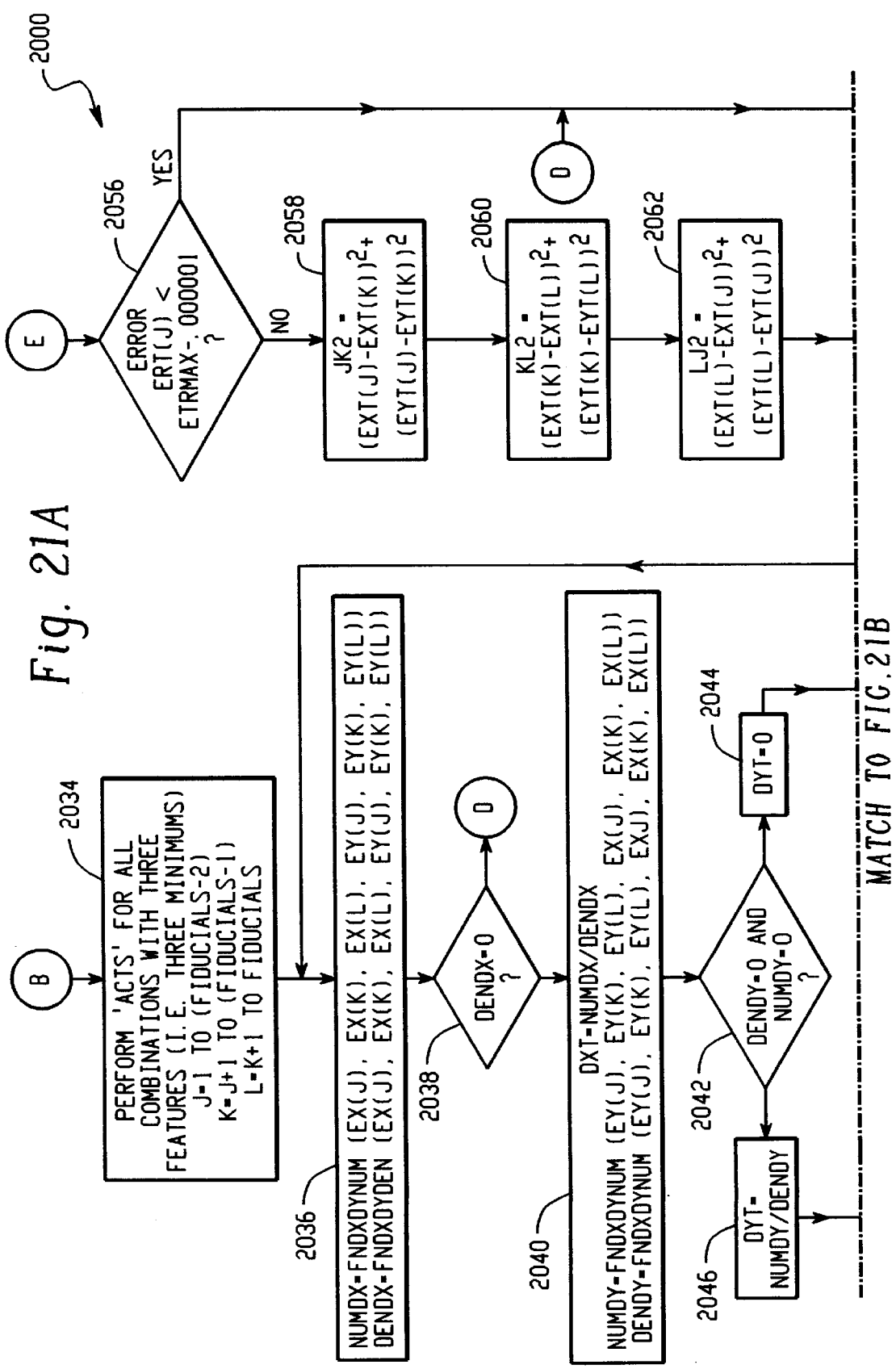
Figure 21B:
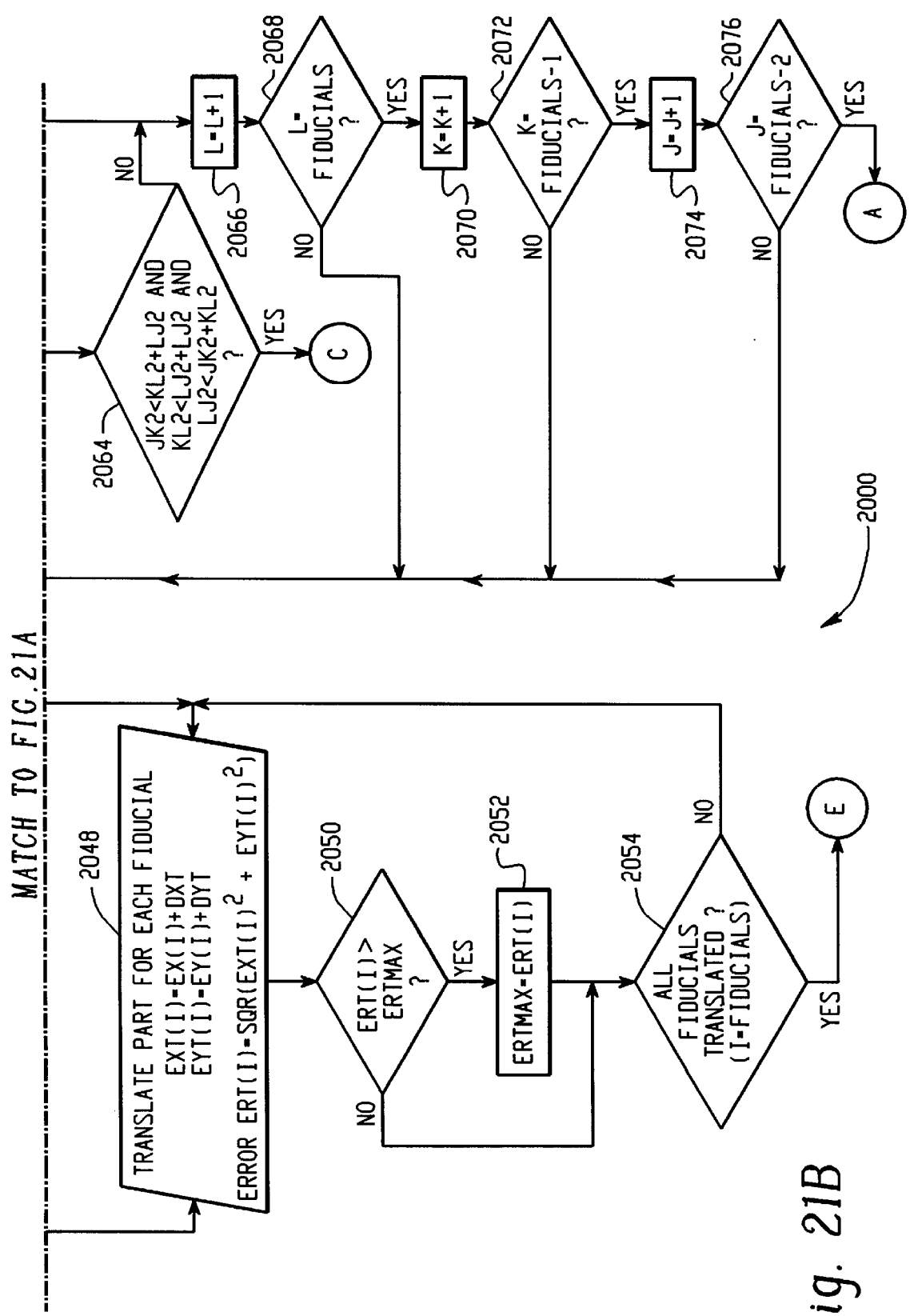
Figure 22:
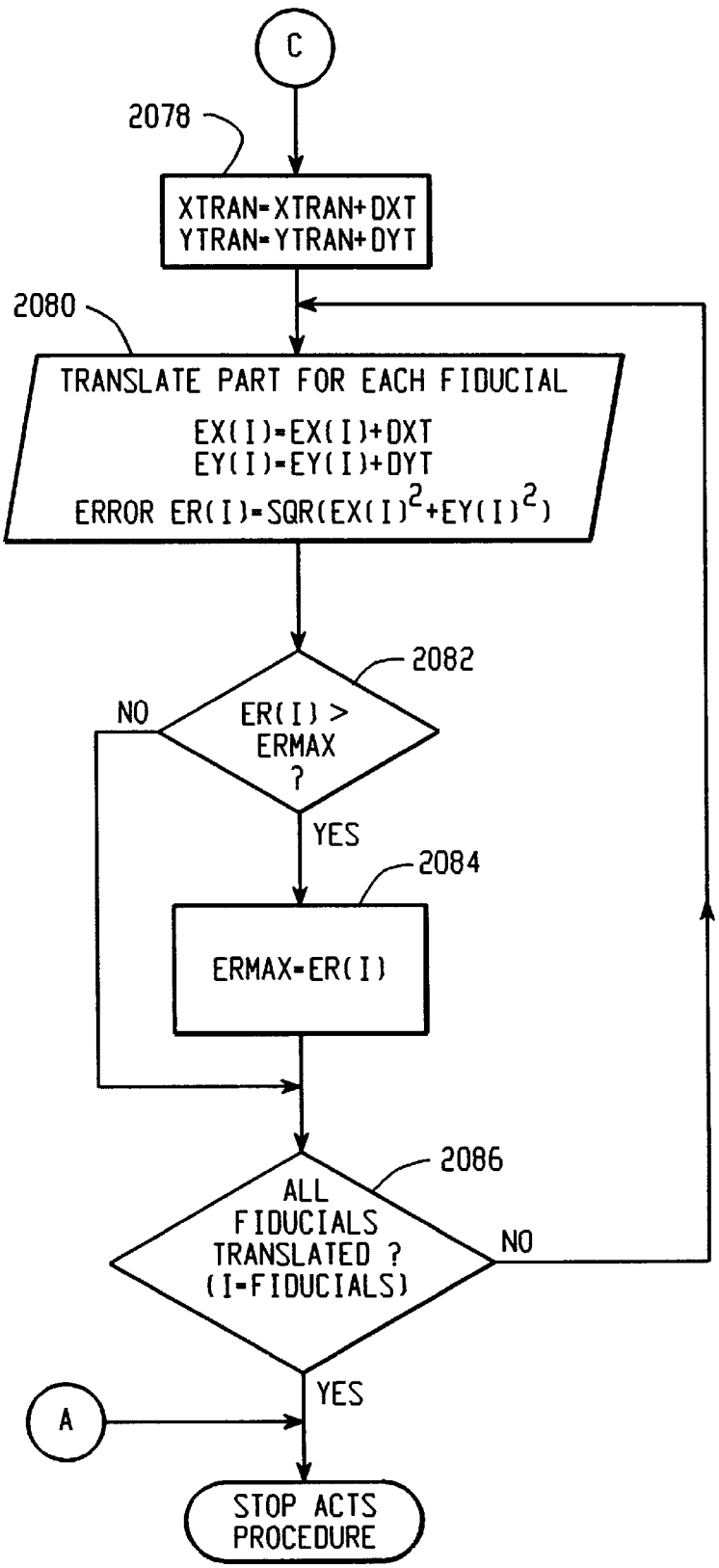

Illustrated in FIGS. 18 and 19 is "Best Fit" procedure 1800 and a graph illustrating how the maximum radial error varies with rotation of an imperfect part. The Best Fit procedure starts in step 1802 where the nominal locations of the fiducials and the errors of features on the imperfect part are read. After step 1802, the Best Fit procedure advances to step 1804. In step 1804, the Best Fit procedure generates and translates a fixed axis coordinate system (axis XP and axis YP) to the mean position of the features on the imperfect part. In the illustrated embodiment, the web W is moved in the XP and YP directions, if necessary, to a position mean position relative to the web W holes. The translate and position procedure of step 1804 is shown in FIG. 23 and described in the text associated with that Figure.

After step 1804, the Best Fit procedure calls an All Combinations Translation Subroutine (hereinafter ACTS) in step 1806. Execution of ACTS results in an interactive calculation which determines maximum radials error and rotation values based on the input of fiducial nominal positions and the relative errors of features on the imperfect part. After ACTS has executed, a maximum radial error value of Y1 and a rotation value of T1 is generated.

After step 1806, the Best Fit procedure advances to step 1808 where the imperfect part is rotated a small increment, i.e. T1, and proceeds to step 1810. In step 1810, the nominal position of all fiducial and the relative feature errors are calculated and ACTS is called again based on the updated input values to perform a second iteration. Execution of ACTS, in step 1810, will result in a new maximum radial error value of Y2 and a new rotation value of T2. After step 1810, the Best Pit procedure advances to step 1812 where the imperfect part is rotated a large increment, i.e. T2.

After step 1812, ACTS is called for a third iteration and new maximum radial error value of Y3 and a new rotation value of T3 are generated in step 1814. After step 1814, the Best Fit procedure advances to step 1816. In step 1816 the part is rotated a small increment, i.e. T3 and the Best Fit procedure advances to step 1818. In step 1818, ACTS is called once again and new maximum radial error and rotation values Y3 and T3 are generated. After step 1818, the Best Fit procedure advances to step 1820 where the maximum radial error value of Y5 and the rotation value of T15 are determined from the previously determined maximum radial error and rotation values (i.e. Y1 and T1, Y2 and T2, Y3 and T3, Y4 and T4, etc). After step 1820, the Best Fit procedure advances to step 1822.

In step 1822, the imperfect part is once again rotated based on the rotation value of T15. After step 1822, the Best Fit procedure advances to step 1824 where ACTS is called to determine a maximum radial error value ERMAX. After step 1824, the Best Fit procedure advances to step 1826. In step 1826, the absolute value of ERMAX-Y5 is tested to determine whether it is less than a given accuracy (i.e. whether the maximum radial error at rotation T15 will be within ERMAX-Y5 of the theoretical minimum [maximum radial error] less than that required by the design specifications.) If so, then the Best Fit procedure ends. If not, then the Best Fit procedure loops back to step 1814 and initiates further iterations of the maximum radial error and rotation values via ACTS in order to attempt to satisfy the test of step 1826. FIG. 19 shows further iterations via the T3 and Y3(2), T4 and Y4(2), T15 and Y5(2), and T15 and ERMAX(2) points. While not shown, it should be apparent to those skilled in the art that the Best Fit procedure may include additional process steps to terminate is a part cannot be aligned within the desired accuracy and to generate outputs signals to the operator indicating such a condition.

Figure 23A:
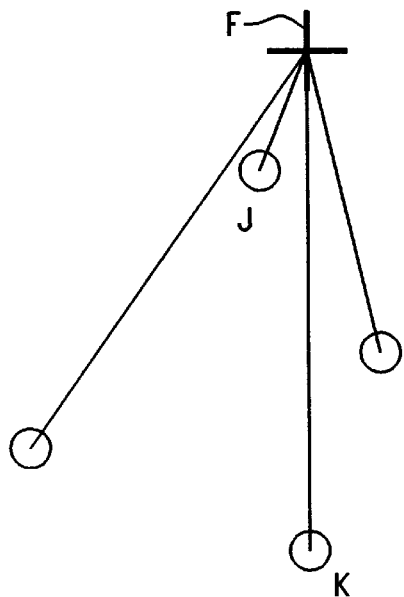
FIGS. 23A–23B and 24A–24B are graphical illustrations of ACT with respect to two and three product features requiring alignment.
Figure 23B:
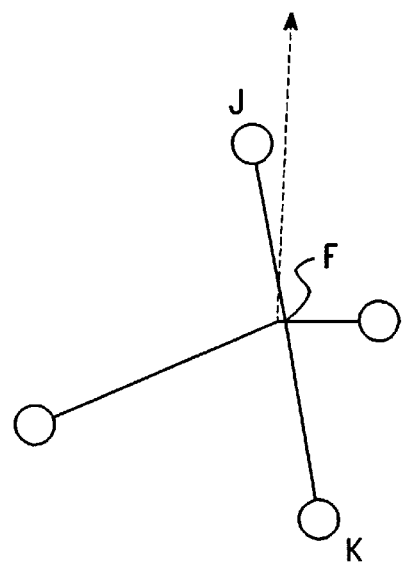

Referring now to FIGS. 20–22 and 23A–24B, the ACTS procedure 2000 is illustrated. The ACTS procedure begins in step 2002 where loop variables are initialized for execution of ACTS for all combination of fiducials and relative feature errors on the part. After step 2002, ACTS proceeds to step 2004 where the mean distances in the XP and UP directions (Shown in FIGS. 17 and 18) for each combination of pairs of fiducial and relative feature errors is determined (i.e. two errors which need to be minimized). The ACTS oprocedure with respect to a part with two errors which need to be minimized is illustrated in FIGS. 23A and 23B. The part includes features J and K and a fiducial F. Since J and K are the only part features, the error vectors from J and K to the fiducial F will be minimized by ACTS. FIG. 23A shows the part and fiducial configuration before translation by ACTS and FIG. 23B show the part and fiducial configuration after ACTS has executed.

After step 2004, ACTS performs a "try move routine" via steps 2006–2012. In step 2006, the relative errors for all of the parts features in their XP and YP directions (EXT(I), EYT(I)) and the radial error values ERROR ERT(I) are determined. In step 2008, each radial error value is tested to determine whether it is greater than a specified ERTMAX value. The illustrated embodiment specifies the initial ERTMAX value of −1, however, other values may be employed. If the ERT(I) value is greater than ERTMAX, then, in step 2010, ERTMAX is set equal the ERT(I). If the ERT(I) value is not greater than ERTMAX, then ACTS advances to step 2012. Step 2012 determines whether all the relative errors (EXT(I), EYT(I) and ERROR ERT(I) ) have been translated. If not, then ACTS loops back to step 2006. If so, then ACTS advances to step 2014.

In step 2014, ACTS tests ERROR ERT for the current fiducial to determine whether it is greater than or equal to ERTMAX−0.000001. If so, then ACTS advances to step 2016 where variables XTRAN and YTRAN are calculated. If not, then ACTS loops back to step 2004 via steps 2026–2032 until all fiducials and part features have been analyzed.

After step 2016, ACTS executes a "move" procedure in steps 2018–2024. This procedure is similar to the "try move" procedure discussed above. In step 2018, the relative errors, for all of the parts features in their XP and YP directions (EX(I), EY(I) and the radial error values ERROR ER(I) are determined. In step 2020, each radial error value is tested to determine whether it is greater than a specified ERMAX value. The illustrated embodiment specifies the initial ERMAX value of −1, however, other values may be employed. If the ER(I) value is greater than ERMAX, then, in step 2022, ERMAX is set equal the ER(I). If the ER(I) value is not greater than ERMAX, then ACTS advances to step 2024. Step 2024 determines whether all the relative errors (EX(I), EY(I) and ERROR ER(I)) have been translated. If not, then ACTS loops back to step 2018. If so, then ACTS advances to step 2034.

Figure 24A:
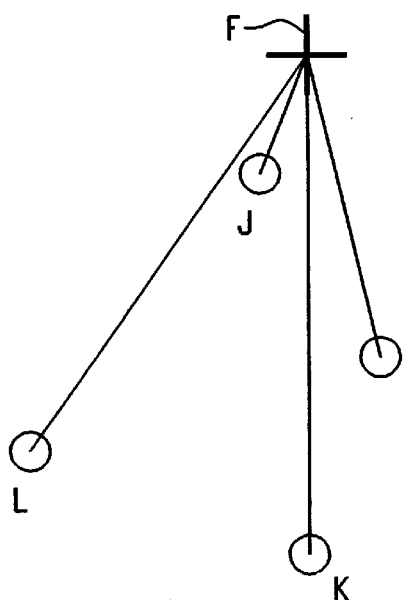
Figure 24B:
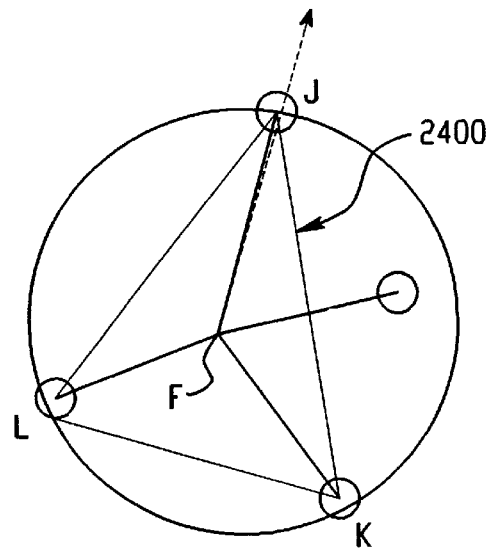

In step 2034, loop variables are initialized for execution of ACTS for all combination of fiducials and relative feature errors on the part with respect to three maximum errors which shall be minimized. The situation is illustrated in FIGS. 24A and 24B. FIG. 24A shows a part with features J, K and L and a fiducial P. The radial vectors JF, KF, and LF represent the relative errors with respect to the fiducial F. FIG. 24B illustrates the part features with respect the fiducial when ACTS has completed executing.

After step 2034, ACTS proceeds to step 2036 where variables NUMDX and DENDX are generated. The variable NUMDX denotes ti) numerator and the variable DENDX denotes the denominator of mean distance variable DX. More specifically, NUMDX is defined by the following function (1):

$$FNDXDYNUM\ (X1,X2,X3,Y1,Y2,Y3)=Y3(X2^2+Y2^2-X1^2-Y1^2)+$$

$$Y2(X1^2+Y1^2-X3^2-Y3^2)+Y1(X3^2+Y3^2-X2^2-U2^2)$$

while DENDX is defined by the following function (2):

$$FNDXDYDEN\ (X1,X2,X3,Y1,Y2,Y3)=2(Y3(X2-X1)+Y2(X1-X3)+Y1(X3-X2))$$

After step 2036, ACTS advances to step 2038 where DENDX is tested to determine whether it is equal to zero. If DENDX is equal to zero, ACTS then loops back to step 2036 via steps 2066–2076 and determines NUMDX and DENDX for the next combination of fiducials and feature part relative errors. If DENDX is not equal to zero the ACTS advances to step 2040 where DXT is calculated and NUMDY and DENDY are calculated using the FNDXDYNUM and FNDXDYDEN functions described above. After step 2040, ACTS proceeds to step 2042 where NUMDY and DENDY are tested to determine whether they are equal to zero. If so, then ACTS proceeds to step 2044 where DYT is set equal to zero. If not, then ACTS proceeds to step 2046 where DYT is calculated based on NUMDY and DENDY. After either step 2044 or 2046, ACTS proceeds to step 2048.

In step 2048, ACTS executes the "try move" procedure where the relative errors for all of the parts features in their XP and YP directions (EXT(I), EYT(I)) and the radial error values ERROR ERT(I) are determined. In step 2050, each radial error value is tested to determine whether it is greater than a specified ERTMAX value. The illustrated embodiment specifies the initial ERTMAX value of −1, however, other values may be employed. If the ERT(I) value is greater than ERTMAX, then, in step 2052, ERTMAX is set equal the ERT(I). If the ERT(I) value is not greater than ERTMAX, then ACTS advances to step 2054. Step 2054 determines whether all the relative errors (EXT(I), EYT(I) and ERROR ERT(I)) have been translated. If not, then ACTS loops back to step 2048. If so then ACTS advances to step 2056.

In step 2056, ACTS tests ERROR ERT for the current fiducial to determined whether it is less than ERTMAX−0.000001. If so, then ACTS loops back to step 2036 via steps 2066–2076 until all fiducials and part features have been analyzed. If not, then ACTS advances to steps 2058–2062 where the variables JK2, KL2 and LJ2 are, respectively, calculated. These variables represent the squared vector lengths between the part's features (see FIG. 24B).

After step 2064, ACTS tests the variables JK2, KL2 and LJ2 are, determine whether any angle between adjacent J, K and L error vectors is greater than 180 degrees (i.e., no error in error triangle 2400 greater than 90 degrees.) If any angle violates the test, than ACTS loops back to step 2036 via steps 2066–2076. If no angle violates the test, then ACTS proceeds to steps 2078–2086.

In steps 2078–2086, ACTS executes a "move" procedure. In step 2078, the variables XTRAN and YTRAN are determined from their current values and DXT and DYT. In step 2080, the relative errors for all of the parts features in their XP and YP directions (EX(I), EY(I)) and the radial error values ERROR ER(I) are determined. In step 2082, each radial error value is tested to determine whether it is greater than a specified ERMAX value. The illustrated embodiment specifies the ERMAX value of −1, however, other values may be employed. If the ER(I) value is greater than ERMAX, then, in step 202084, ERMAX is set equal the ER(I). If the ER(I) value is not greater than ERMAX, then ACTS advances to step 2086. Step 2086 determines whether all the relative errors (EX(I), EY(I) and ERROR ER(I)) have been translated. If not, then ACTS loops back to step 2080. If so, then ACTS has completed executing.

Figures 25, 27:
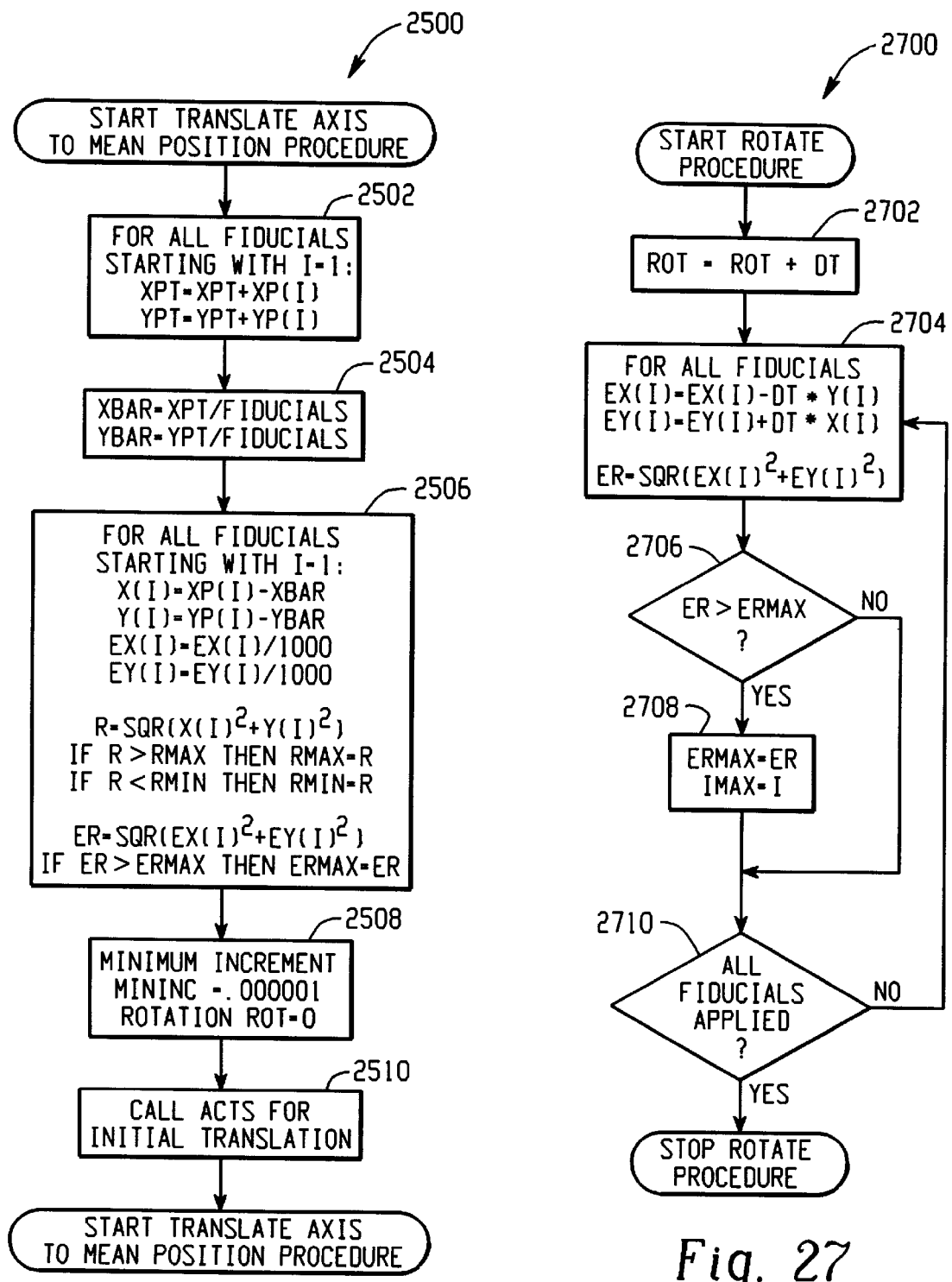
FIG. 25 is a flowchart illustrating the Translate Axis to Mean Position Procedure.
FIG. 27 is a flowchart illustrating the Rotation Procedure of the present invention.

Illustrated in FIG. 25 is a flowchart showing the translate axis to mean position procedure 2500 of the Best Fit procedure. The translate axis to mean position procedure 2500 starts in step 2502 where for each fiducial, its position (XP(I) and YP(I)) are summed into XPT and YPT. After step 2502, the procedure advances to step 2504 where XBAR and YBAR are calculated. The variables XBAR and YBAR represent the mean position of all the fiducials. After step 2506, the procedure advances to step 2506. In step 2506, the fiducial coordinates are converted to values based on the newly generated Cartesian axis (XBAR and YBAR). These include the fiducial coordinates X(I) and Y(I), the relative error to the part features EX(I) and EY(I) and the radial distance R from the origin of the new axis (at XBAR, YBAR) to the current fiducial's coordinates (X(I), Y(I)). The maximum radial distance R is set to RMAX and the minimum radial distance R is set to RMIN. Moreover, the radial error distance ER is determined for each fiducial and the variable ERMAX is set to ER if ER is greater than the current value of ERMAX.

After step 2506, a minimum increment variable MININC and a rotation variable ROT are set. After step 2506, the procedure calls ACTS for an initial translation. This step has the effect of positioning the new axis to the mean position of the fiducials. After step 2510, the translate axis to mean position procedure ends.

Figure 26:
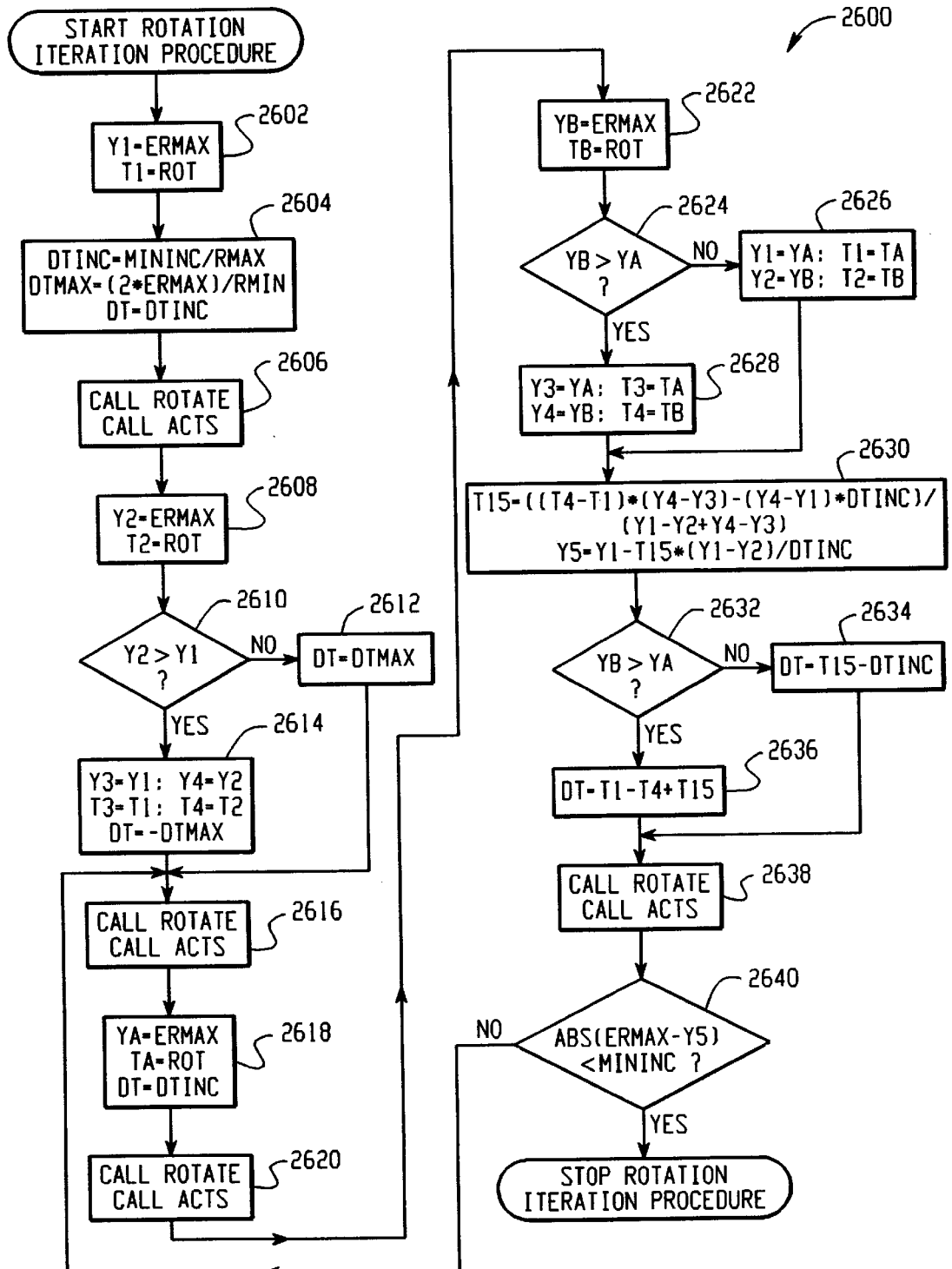
FIG. 26 is a flowchart illustrating the Rotation Iteration Procedure of the present invention.

The rotation iteration procedure shown in steps 1806–1826 of FIG. 18 is shown in greater detail in the flowchart of FIG. 26. In particular, steps 1806–1808 are further detailed by steps 2602–2604. Steps 1810–1812 are further detailed in steps 2606–2614. Steps 1814–1816 are further detailed in steps 2616–2618. Steps 1818–1820 are further described in steps 2622–2636. Steps 1822–1826 are further described in steps 2638–2640.

Illustrated in FIG. 27 is the rotation procedure 2700 of the Best Fit procedure. The rotation procedure begins in step 2702 where the variable ROT is incremented by DT. After step 2702, the rotation procedure advances to step 2704 where all of the error distances EX(I) and EY(I) are calculated based on their current values, DT and the fiducial coordinates X(I) and Y(I) respectively. Also, in step 2704, the radial error distance ER is calculated. In step 2706, the radial error ER is tested to determine whether it is greater than ERMAX. If so, ERMAX is set equal to ER and IMAX is set equal to I. The variable I is equal to the number of fiducials and thus IMAX keeps track of the fiducial with the largest radial error. If ER is not greater than ERMAX in step 2706, or after step 2708 has completed, the rotation procedure advances to step 2710. In step 2710, the rotation procedure determines if steps 2704–2708 have executed for all fiducials. If so, the rotation procedure ends. If not, then the rotation procedure loops back to step 2704 for the next fiducial to be analyzed.

While the present invention has been illustrated by the description of embodiments thereof, and while the embodiments have been described in considerable detail, it is not the intention of application to restrict or in any way limit the scope of the appended claims to such detail. Additional advantages and modifications will readily appear to those skilled in the art. For example, but not by way of limitation, certain procedures may be called or implemented in different sequences and certain procedures may be subroutined into one or more subroutines. Therefore, the invention, in its broader aspects, is not limited to the specific details, the representative apparatus, and illustrative examples shown and described. Accordingly, departures may be made from such details without departing from the spirit or scope of the applicant's general inventive concept.

What is claimed is:

1. A method for minimizing the maximum radial error between all fiducials of an alignment device and features of an apparatus, the method comprising the steps of:

(a) locating a first axis position;

(b) determining the nominal positions of all fiducials;

(c) determining the nominal values of all errors of features relative to all fiducials;

(d) translating a first axis position to a second axis position based on a mean position of all features;

(e) iteratively rotating and translating the alignment device until a maximum radial error is achieved that is less than a specified amount which is greater than the theoretical minimum maximum radial error; wherein this step comprises the steps of:

(1) rotating the alignment device through a first angle;

(2) translating the alignment device through a first radial distance;

(3) updating the nominal positions of all fiducials and nominal values of all errors of features relative to all fiducials;

(4) rotating the alignment device through a second angle that is larger than the first angle and determined from updated fiducial nominal positions and updated nominal values of all errors; of features relative to all fiducials;

(5) translating the alignment device through a second radial distance;

(6) rotating the alignment device through a third angle that is less than the second angle and based upon updated fiducial nominal positions and updated nominal values of all errors of features relative to all fiducials;

(7) translating the alignment device through a third radial distance;

(8) calculating a final rotation angle from the updated fiducial nominal positions and updated nominal values of all errors of features relative to all fiducials;

(9) rotating the alignment device through the final rotation angle;

(10) calculating a final minimum maximum radial error for each fiducial and each feature; and

(11) translating the alignment device through the final minimum radial error.

2. The method of claim 1 wherein the step of iteratively rotating and translating the alignment device until a maximum radial error is achieved that is less than a specified amount which is greater than the theoretical minimum maximum radial error further comprises the step of comparing the final minimum maximum radial error for each fiducial and each feature to a predetermined value.

3. The method of claim 2 wherein the step of iteratively rotating and translating the alignment device until a maximum radial error is achieved that is less than a specified amount which is greater than the theoretical minimum maximum radial error further comprises the step of rotating and translating the alignment device through subsequent angles and radial distances.

4. A method for minimizing the maximum radial error between at least one fiducial of an alignment device and at least two features of an apparatus, the method comprising the steps of:

(a) inputting the at least one fiducial's coordinates;

(b) determining initial relative error distances from the at least one fiducial to the at least two features; and (c) iteratively translating and rotating the alignment device until the relative error distances from the at least one fiducial to the at least two features is within a specified minimum value, wherein the step includes the steps of:

(1) determining the mean radial distance of the at least one fiducial from each of the at least two features;

(2) determining the radial distance of each of the at least two features from the mean radial distance;

(3) comparing the radial distance of each of the at least two features from the mean radial distance to a predetermined valued; and (4) if the radial distance of any of the at least two features from the mean radial distance is greater than or equal to the predetermined value, translating the alignment device a radial distance equal to the mean radial distance of the at least one fiducial from each from the at least two features.

5. The method of claim 4 further comprising the step of translating a first axis to a mean position axis, wherein the step comprises the steps of:

(a) converting the at least one fiducial's coordinates to a mean coordinate system and (b) determining a radial distance of the at least one fiducial from the origin of the mean coordinate system.

6. The method of claim 4 further comprising a plurality of fiducials and further comprising the step of determining a mean position of all the plurality of fiducials.

7. The method of claim 6 wherein the step of iteratively translating and rotating the alignment device until the relative error distances from the at least one fiducial to the at least two features is within a specified minimum value further comprises the steps of:

(a) determining a rotation increment value based on a maximum radial distance of the at least one fiducial from a predetermined axis origin; and (b) determining a maximum rotation value based on a minimum radial distance of the at least one fiducial from the mean position of all the plurality of fiducials.

8. The method of claim 7 wherein the step of iteratively translating and rotating the alignment device until the relative error distances from the at least one fiducial to the at least two features is within a specified minimum value further comprises the step of rotating the apparatus through an angle equal to the minimum rotation increment value.

* * * * *

UNITED STATES PATENT AND TRADEMARK OFFICE
CERTIFICATE OF CORRECTION

PATENT NO. : 5,908,722
DATED : June 1, 1999
INVENTOR(S) : Edward Joseph Burke, Donald Frederick Carter, David Martin Dewey-Wright, David Eric Houser, John Thomas Legg, Daniel Webster It is certified that error appears in the above-identified patent and that said Letters Patent is hereby corrected as shown below:

IN THE ABSTRACT:
    line 7, after "first", first occurrence, change "patterns" to --pattern--.

IN THE CLAIMS:
    Claim 1, line 18, after "first" delete the colon ":".
    line 26, after "errors" delete the semicolon ";".

Claim 4, line 21, after "predetermined" change "valued" to --value--.
    line 27, before "the" change "from" to --of--.

Signed and Sealed this

Twenty-ninth Day of February, 2000

Attest:

Q. TODD DICKINSON

*Attesting Officer*    *Commissioner of Patents and Trademarks*